United States Patent [19]
McArdle et al.

[11] Patent Number: 5,916,641
[45] Date of Patent: Jun. 29, 1999

[54] METHOD OF FORMING A MONOLAYER OF PARTICLES

[75] Inventors: Ciaran B. McArdle, Dublin; Joseph Burke, Ballinteer, both of Ireland; Edward K. Welch, II, Bristol, Conn.

[73] Assignees: Loctite (Ireland) Limited, Dublin, Ireland; Loctite Corporation, Hartford, Conn.

[21] Appl. No.: 08/693,833

[22] Filed: Aug. 1, 1996

[51] Int. Cl.$^6$ ............... H01F 1/00; H01F 1/28; H01F 10/10; H01B 1/06

[52] U.S. Cl. ............... 427/487; 427/128; 427/130; 427/131; 427/180; 427/385.5; 427/496; 427/508; 427/551; 427/558; 427/559; 427/595; 427/598

[58] Field of Search ............... 427/496, 508, 427/551, 558, 559, 595, 128, 130, 131, 180, 385.5, 598, 487

[56] References Cited

U.S. PATENT DOCUMENTS

| | | | |
|---|---|---|---|
| 2,718,506 | 9/1955 | Elleman | 252/513 |
| 3,359,145 | 12/1967 | Salyer et al. | 156/1 |
| 3,661,744 | 5/1972 | Kehr et al. | 204/159.14 |
| 3,843,540 | 10/1974 | Reimers et al. | 252/62.51 |
| 3,898,349 | 8/1975 | Kehr et al. | 427/36 |
| 3,917,538 | 11/1975 | Rosenweig | 252/62.52 |
| 4,008,341 | 2/1977 | Kehr | 427/44 |
| 4,092,376 | 5/1978 | Douek et al. | 260/884 |
| 4,100,088 | 7/1978 | Haas et al. | 252/62.52 |
| 4,170,677 | 10/1979 | Hutcheson | 428/119 |
| 4,215,209 | 7/1980 | Ray-Chaudhuri | 526/292 |
| 4,368,131 | 1/1983 | Rosenweig | 252/62.55 |
| 4,430,239 | 2/1984 | Wyman | 252/62.51 |

(List continued on next page.)

FOREIGN PATENT DOCUMENTS

| | | | |
|---|---|---|---|
| 0208391 | 1/1987 | European Pat. Off. | H01F 1/28 |
| 0232127 | 8/1987 | European Pat. Off. | H01R 4/04 |
| 0299618 | 1/1989 | European Pat. Off. | H01F 1/28 |
| 0330452 | 8/1989 | European Pat. Off. | C09J 7/02 |
| 0402546 | 12/1990 | European Pat. Off. | H05K 3/12 |
| 0549159 | 6/1993 | European Pat. Off. | H01R 4/04 |
| 0691660 | 1/1996 | European Pat. Off. | H01B 1/22 |
| 940077 | 1/1994 | Ireland . | |
| 940078 | 1/1994 | Ireland . | |
| 62-127194 | 6/1987 | Japan | B23K 35/40 |
| 3-095298 | 4/1991 | Japan | C10M 169/04 |
| 6-122857 | 5/1994 | Japan | C09J 9/02 |

(List continued on next page.)

OTHER PUBLICATIONS

Berglund, R.N. et al., Generation of Monodisperse Aerosol Standards, Environmental Sci. and Tech. 7(2) p. 147 1973 (No month avail.).

Wu, H.F. et al., Effect of Surfactant Treatments on Interfacial Adhesion in Single Graphite/Epoxy Composites, Polymer Composites 12(4), 281 1993 (No month avail.).

Rao, A.V. et al., Evolution of Polymerisable Surfactants, Paint and Ink Int'l 15, 1995 (No month avail.).

Holmberg, K., Novel Surfactants for Paints, Surface Coatings Int'l (12) 481, 1993 (No month avail.).

Kim, Two– and Three–Dimensional Crystalization of Polymeric Microspheres by Micromolding in Capillaries, Advanced Materials, 8(3), 245–247, 1996 (No month avail.).

(List continued on next page.)

*Primary Examiner*—Bernard Pianalto
*Attorney, Agent, or Firm*—Vidas, Arrett & Steinkraus

[57] ABSTRACT

The present invention provides for a number of interrelated methods for the production of random and ordered arrays of particles as well as films containing the same. In another aspect, the present invention relates to the random and ordered arrays of particles and films prepared therefrom. The ordered arrays are obtained by the use of ferrofluid compositions which may be curable, solidifiable or non-curing/non-solidifiable. Especially preferred arrays and films contain electrically conductive particles for use in electronic applications for effecting contact between leads or pads.

8 Claims, 12 Drawing Sheets

U.S. PATENT DOCUMENTS

| | | | |
|---|---|---|---|
| 4,548,862 | 10/1985 | Hartman | 428/323 |
| 4,604,229 | 8/1986 | Raj et al. | 252/510 |
| 4,644,101 | 2/1987 | Jin et al. | 178/18 |
| 4,645,611 | 2/1987 | Campbell et al. | 252/62.51 |
| 4,698,907 | 10/1987 | Soszek | 29/846 |
| 4,701,276 | 10/1987 | Wyman | 252/62.52 |
| 4,737,112 | 4/1988 | Jin et al. | 439/66 |
| 4,740,657 | 4/1988 | Tsukagoshi et al. | 174/88 |
| 4,741,850 | 5/1988 | Wyman | 252/62.52 |
| 4,808,638 | 2/1989 | Steinkraus et al. | 522/24 |
| 4,846,988 | 7/1989 | Skjeltorp | 252/62.52 |
| 4,855,079 | 8/1989 | Wyman | 252/62.52 |
| 4,867,910 | 9/1989 | Meguro et al. | 252/519 |
| 4,935,147 | 6/1990 | Ullman et al. | 210/695 |
| 4,938,886 | 7/1990 | Lindsten et al. | 252/62.51 |
| 4,946,613 | 8/1990 | Ishikawa | 252/62.52 |
| 4,963,220 | 10/1990 | Bachmann | 156/307.3 |
| 4,965,007 | 10/1990 | Yudelson | 252/62.53 |
| 4,992,190 | 2/1991 | Shtarkman | 252/62.52 |
| 4,997,717 | 3/1991 | Rembold et al. | 478/413 |
| 5,064,550 | 11/1991 | Wyman | 252/62.52 |
| 5,075,034 | 12/1991 | Wanthal | 252/511 |
| 5,076,950 | 12/1991 | Ullman et al. | 252/62.51 |
| 5,084,490 | 1/1992 | McArdle et al. | 522/181 |
| 5,085,789 | 2/1992 | Yokouchi et al. | 252/62.52 |
| 5,124,060 | 6/1992 | Yokouchi et al. | 252/62.51 |
| 5,128,215 | 7/1992 | Pendergrass, Jr. | 428/694 |
| 5,141,970 | 8/1992 | McArdle et al. | 522/170 |
| 5,147,573 | 9/1992 | Changnon | 252/62.52 |
| 5,167,850 | 12/1992 | Shtarkman | 252/62.52 |
| 5,180,888 | 1/1993 | Sugiyama et al. | 174/94 |
| 5,221,417 | 6/1993 | Basavanhally | 156/629 |
| 5,346,558 | 9/1994 | Mathias | 148/23 |
| 5,349,478 | 9/1994 | Sato et al. | 360/55 |
| 5,366,140 | 11/1994 | Koskenmaki et al. | 228/246 |
| 5,380,549 | 1/1995 | Harvison | 427/137 |
| 5,382,373 | 1/1995 | Carlson et al. | 252/62.55 |
| 5,438,223 | 8/1995 | Higashi et al. | 257/774 |
| 5,486,427 | 1/1996 | Koskenmaki et al. | 428/546 |
| 5,543,397 | 8/1996 | Drauz et al. | 514/19 |

FOREIGN PATENT DOCUMENTS

| | | | |
|---|---|---|---|
| 919502 | 2/1963 | United Kingdom . | |
| 93/02148 | 1/1993 | WIPO | C09J 163/00 |
| 95/18476 | 7/1995 | WIPO | H01R 13/24 |
| 95/20820 | 8/1995 | WIPO | H01E 1/44 |

OTHER PUBLICATIONS

Williams et al, The Effects of Conducting Particle Distribution on the Behaviour of Anistropic Conducting Adhesives: Non–Uniform Conductivity and Shorting Between Connections, Journal of Electronics Manufacturing, 3, 85–94, 1993 (No month avail.).

Hogerton, Development Goals and Present Status of 3M's Adhesive Interconnection Technology, Journal of Electronics Manufacturing, 3, 191–197, 1993 (No month avail.).

Ogunjimi, A Review of the Impact of Conductive Adhesive Technology on Interconnection, Journal of Electronics Manufacturing, 2, 109–118, 1992 (No month avail.).

Liu, Applications of Anistropically Conductive Adhesives and Films as Surface Mount Solder Joints Substitute—a Survey, IVF–Internal Report 91/04, 32–36 (No date avail.).

Skjeltorp, A.T., One– and Two–Dimensional Crystallization of Magnetic Holes, Physical Review Letters, 51(25) 2306–2309, Dec. 19, 1983.

Skjeltorp, A.T., Colloidal Crystals in Magnetic Fluid, Conference on Magnetism & Magnetic Materials, 163–164, Nov. 1983.

Skjeltorp, A.T., Ordering Phenomena of Particles Dispersed in Magnetic Fluids, Journal of Applied Physics, 57(1), 3285–3289, Apr. 15, 1985.

Skjeltorp, A.T., Monodisperse Particles and Ferrofluids: A Fruit–fly Model System, Journal of Magnetism and Magnetic Materials, 65, 195–203, 1987 (No month avail.).

Rosensweig, Magnetic Fluids, Annual Review of Fluid Mechanics, 19, 437–63, 1987 (No month avail.).

Soszek, Two Novel Additive Processes to Create Circuitry: Direct Laser Writing and Direct Electrostatic Transfer Deposirtion, Circuit World, 19(4), 12–15, 1993 (No month avail.).

Skeltorp A. T. et al., Condensation and Ordering of Colloidal Spheres Dispersed in a Ferrofluid, Physica A 176, 37, 1991 (No month avail.).

Ferromagnetic Materials, Wohlfarth, E.P. ed., vol. 2, ch. 8, p. 509 Charles, S.W., Popplewell, J., Martinet A. Elsevier Sci. Publishing Co. 1983 (No month avail.).

Aggregation Processes in Solution, Wyn–Jones, E., Gormally, J. Ch. 18, p. 509 (No date avail.).

Li and Morris, Structure and Selection Models for Anisotropic Conductive Adhesive Films, First Int'l Conference on Adhesive Joining Technology in Electronics Mfr., Berlin, Nov. 1994.

Shaw, Chemistry and Technology of Epoxy Resins, B. Ellis ed., ch. 7 p. 206, Blackie Academic and Professional, 1993 (No month avail.).

Shiozawa, Electric Properties of Connections by Anisotropic Conductive Film, First Int'l Conf. on Adhesive Joining Technology in Electronics Mfr., Berlin, Nov. '94.

Lyons & Dahringer, *Handbook of Adhesives Technology*, Pizzi & Mittal, eds., p. 578, 1994 (No month avail.).

Nakao Y., Preparation and Characterization of Noble Metal Solid Sols in Poly(methyl methacrylate), J. Chem. Soc. Chem. Commun. 826, 1993 (No month avail.).

Nakao Y. & Kaeriyama K., Preparation of Noble Metal Sols in the Presence of Surfactants and thie Properties, J. Colloid Interface Sci. 110(1), 82, 1986 (No month avail.).

Klabunde et al., Colloidal Metal Particles Dispersed in Monomeric and Polymeric Styrene and Methyl Methacrylate, Chemistry of Materials 1, 481, 1989 (No month avail.).

Cardenas T., G., Synthesis and Molecular Weights of Metal (Styrene–Methyl Methacrylate) Copolymer. III,, Polymer Bull. 27, 383, 1992 (No month avail.).

Cardenas T., G., Synthesis and Molecular Weights of of Metal Polyacrylonitriles, Polymer Bull. 26, 611, 1991 (No month avail.).

Rios P. et al., Poly(butadiene–acrylic acid(g)acrylonitrile(g) acrylic acid), Polymer Bull. 31, 293–296, 1993 (No month avail.).

Popplewell J. et al., Microwave Properties of Ferrofluid Composites, J. Magnetism and Magnetic Materials 54–57, 761, 1986 (No month avail.).

Kopcansky, P., The Observation of Various Structures of Magnetic Particles and Magnetic Holes in Ferrofluids, Acta Phys. Slov. 39(4), 259, 1989 (No month avail.).

Jin et al, Anisotropically Conductive Polymer Films With a Uniform Dispersion of Particles, IEEE Transcations on Components, Hybrids and Manufacturing Technology, 16(8), Dec. 1993, 972–977.

Holman, Pilot Plant Helps Ablestik in Development of Specialized Tapes, Adhesives Age, Jan. 1995, 30–31.

Hitachi Chemical Data Sheet, Specification of Anisolm AC 6073 (Date unknown).
ThreeBond Co. Brochure, ThreeBond 3370 Anisotropically Electroconductive Adhesive Film (Date unknown).
ThreeBond Co. Brochure, ThreeBond 3300 Series, Conductive Resin, Adhesive, Paste and Coating Material (Date unknown).
Skjeltorp, Colloidal Crystals in Magnetic Fluid, Journal of Applied Physics, 55(6) pt.2B, 2587–8, 1984 (No month avail.).
IBM Technical Disclosure Bulletin, 17(6), 1842–43, Nov. 1974.
Babiarz, Chip Size Packaging, Advanced Packaging, May/Jun. 1995.
Derwent Abstract 88–114223/17 Date unknown WPIL 211.
Derwent Abstract 88–113862/17 Date unknown.
Derwent Abstract 87–032270/05 Date unknown.
Derwent Abstract 87–018716/03 Date unknown.
Derwent Abstract 87–018508/03 Date unknown.
Dyno Particles Brochure on polymer particles, Oct. 1991.
McArdle et al., Novel Uniaxial Conductive Adhesives Polymerisable Ferrofluids and Conductive Magnetic Holes, Proc. Adhesives in Electronics, Stockholm, Sweden, Jun. 3–5, 1996.
Author unknown, Fluid Has World's Highest Magnetic Flux Density, J. Electronic Engineering, 27 (280), 64–66, Apr. 1990.
Derwent Abstract Secondary Accession C89–048416 Date unknown.
Derwent Abstract 87–196399/28 Date unknown.
Derwent Abstract 86–314250/48 Date unknown.
Derwent Abstract 68–97057P/00 Date unknown.
Derwent Abstract 82–55954E/27 Date unknown.
Derwent Abstract AN 86–261618 Date Unknown.
Reactive Surfactants and Reactive Protective Colloids—Brochure (May 1, 1996).
Reilly, J. O. et al., Anisotropic Adhesive Progress Report, Apr. 5, 1993.
Ferrofluidics Corporation Technology Note, Date Unknown.

METHOD OF FORMING A MONOLAYER OF PARTICLES

BACKGROUND OF THE INVENTION

1. Field of the Invention

This invention relates to a method of forming a monolayer of particles, and to products formed thereby. It is particularly concerned with forming an ordered array of particles in a monolayer, but is not so limited. The monolayer of particles may be incorporated into a film. The invention is especially directed to films having anisotropic conductive pathways formed by ordered arrays of conductive particles, especially for use in interconnection technology in the electronics industry. However the invention also has utility in other fields of technology and may be applied to particles which are not electrically conductive.

2. Description of Related Art

Prior art relating to anisotropically-conductive adhesives and to the ordering of "magnetic holes" in ferrofluids is discussed in our International Patent Application WO 95/20820, the contents of which are incorporated herein by reference.

Japanese Patent Application J62127194-A of Fujikura Cable Works KK describes the production of anisotropic conductive solder sheets by forming an adhesive coating having a thickness of less than 10 micrometers on a support film, applying soft solder powder having a grain size of 10–50 micrometers onto the adhesive coating, and filling the spaces between granules of the solder with a plastic material. It is stated that the soft solder granules can be evenly dispersed in the plastic material on the film. However application of particles onto an adhesive film to which the particles adhere on contact is not likely to achieve satisfactory dispersion or ordering of the particles in the plane of the film.

EP 0 691 660 A1 of Hitachi Chemical Co. Ltd. describes an anisotropically electro-conductive film material produced by adhering electro-conductive particles to an adhering layer formed on a support and fixing the particles therein, and then introducing a film-forming resin incompatible with the adhering material between the electro-conductive particles, the film material having electro-conductivity only in the film thickness direction via the electro-conductive particles uniformly dispersed in the plane direction. The particles may be arranged in a grid or zig zag pattern in the plane by means of a film, net or screen having holes therein (hereafter called a "screen"), through which the particles are fixed on the adhering layer. The particles and the screen may be electrostatically charged with different electric charges. However the use of a screen having holes therein gives rise to a number of problems including the difficulty of producing and handling thin screens, and of making the desired patterns of holes therein. An individual screen would be required for each pattern. Also it would be difficult to ensure that all of the holes are filled by particles and to guard against clogging of some of the holes by the adhesive material. Removal of the screen may also cause disruption of the pattern. The use of electrostatic charging would be a complex procedure involving large electrical fields.

U.S. Pat. No. 5,221,417 Basavanhally describes the use of photolithographic masking and etching to form a matrix array of mutually isolated ferromagnetic elements. These elements are magnetized and a single layer of conductive ferromagnetic particles is adhered to an upper surface of each of the ferromagnetic elements, so that the conductive particles are in an array. The layer of particles is then contacted with a layer of soft adhesive polymer to cause penetration of the particles into the polymer. The adhesive polymer is then hardened to assure containment of the particles in the polymer. The adhesive polymer with the conductive particles therein is used for interconnecting conductor arrays. However this technique can only be used with conductive particles which are ferromagnetic. Such particles may be difficult to obtain in specific preferred shapes, sizes and types e.g. monodisperse spheres.

In WO 95/20820 (hereafter called "the first parent application"), we have described a composition comprising: (i) a ferrofluid comprising a colloidal suspension of ferromagnetic particles in a non-magnetic carrier liquid, and (ii) a plurality of electrically-conductive particles having substantially uniform sizes and shapes, dispersed in the ferrofluid.

Preferably the average particle size of the electrically conductive particles is at least 10 times (and more particularly 100 times, most preferably 500 times) that of the colloidal ferromagnetic particles. The non-magnetic carrier liquid may be curable or non-curable and may be selected from:

(i) a curable liquid composition,
(ii) a mixture of a curable liquid composition and a liquid carrier in which the ferromagnetic particles have been suspended, and
(iii) a non-curable carrier liquid, but if the carrier liquid is non-curable and the curable liquid composition is not present, the electrically-conductive particles have a latent adhesive property.

In the first parent application we have also described a method of making an anisotropically-conductive bond between two sets of conductors, comprising:

(a) applying to one set of conductors a layer of an adhesive composition comprising a curable particle-loaded ferrofluid composition as described above;
(b) bringing a second set of conductors against the layer of adhesive composition;
(c) exposing the layer of adhesive composition to a substantially uniform magnetic field such that interaction between the ferrofluid and the electrically-conductive particles causes the electrically-conductive particles to form a regular pattern of particles each in electrical contact with an adjacent particle and/or with a conductor in one or both sets whereby conductive pathways are provided from one set of conductors to the other set, each pathway comprising one or more of the electrically-conductive particles; and
(d) curing the composition to lock the pattern in position and to bond the conductors.

However it may not always be convenient to install a means for creating a magnetic field at the location of assembly of two sets of conductors. Therefore in Irish Patent Application No. 950589 filed Aug. 1, 1995 (hereafter referred to as "the second parent application", the contents of which are incorporated herein by reference) we have described other ways of achieving the benefits of the invention of the parent application.

The second parent application describes an anisotropically-conductive film or a substrate having a surface coated with an anisotropically-conductive coating, said film or coating being formed by solidifying a composition comprising:

(i) a solidifiable ferrofluid composition, the ferrofluid comprising a colloidal suspension of ferromagnetic particles in a non-magnetic carrier, and (ii) a plurality of electrically-conductive particles, dispersed in the ferrofluid,
said electrically-conductive particles having been arrayed in a non-random pattern by application of a substantially uniform magnetic field to the composition in a liquid state and having been locked in position by solidification of the composition.

Furthermore, the second parent application describes a solid-form anisotropically-conductive film or a substrate having a surface coated with a solid-form anisotropically-conductive coating, said film or coating comprising a composition containing colloidal ferromagnetic particles and a plurality of electrically-conductive particles arrayed in a non-random pattern.

The term "ferromagnetic" as used in the second parent application and also used herein includes ferrimagnetic materials such as ferrites.

The term "solidifiable" as used in the second parent application and also used herein means capable of existing as a solid at ambient temperatures e.g. temperatures less than 40° C., more usually 20–30° C. Solidifiable compositions include curable compositions which cure to solid form by heat treatment or otherwise. The word "solid" as used in the second parent application means stable in shape and includes a gel or polymer network.

The inventions of the first and second parent applications are a significant breakthrough in the uniform dispersion of conductive particles and address the issue of particle aggregation and the consequences in fine pitch electronic interconnection (cf. U.S. Pat. No. 5,221,417 Basanvanhally). However the preparation of a curable particle-loaded ferrofluid adhesive composition requires a compromise between the desired ferrofluid character of the composition, including high magnetization saturation and low viscosity at room temperature for rapid ordering of the particles, and the desired adhesive character of the composition, including the use of medium to high molecular weight systems having relatively high viscosity, to impart good mechanical properties and functionality to the cured adhesive.

It is an object of the present invention to overcome some of the limitations in the inventions of the first and second parent applications.

It is also an object of the present invention to have wider utility in overcoming problems in the operation of the technology of EP 0 691 660 A1 and generally of arranging a monolayer of dispersed or ordered particles.

In respect of the foregoing, it is an object of the present invention to attain processes for the preparation of monolayers of dispersed or ordered arrays of particles as well as films containing the same which processes are easy, fast and employ readily available, easy to manufacture components and which allow for the reuseability/recovery of otherwise expensive and/or regulated materials.

It is also an object of the present invention to prepare stable monolayers of particles and arrays of particles and films containing the same which are free or substantially free of ferromagnetic particles.

It is also an object of the present invention to prepare films containing random and ordered arrays of particles with improved physical and performance characteristics, e.g., improved strength and/or adhesiveness as well as transparency or translucency, and the like.

SUMMARY OF THE INVENTION

In one aspect, the present invention provides a number of interrelated methods for producing monlayered random and ordered arrays of particles which are locked in place, at least temporarily, by use of a cured tack layer. These methods employ the use of a curable matrix in which the particles are dispersed and the curable matrix is partially cured to form a thin film which holds the particles in place but does not substantially encase the particles.

In a related aspect, the present invention also provides a number of interrelated methods for producing films from the foregoing wherein the particles are locked and contained within a film. In these methods, the aforementioned monlayers of particles are backfilled with a film-forming material which substantially encases and securely locks in place the particles.

In yet another related aspect the present invention provides a method of producing such order arrays and films containing the same by use of a curable ferrofluid and a magnetic field wherein the so formed array and films are free of or substantially free of ferrofluid or ferromagnetic particles. In one aspect of this embodiment, the particles are transferred from the cured curable ferrofluid material to an adhesive or latent adhesive free of the ferromagnetic particles.

The present invention also provides for the preparation of the ordered arrays and films containing the ordered array of particles by use of standard ferrofluids or ferrofluid waxes wherein the ordered array is locked in place by pressing the ordered array in the ferrofluid or ferrofluid wax then transferred, under pressure upon the particles, to an adhesive, latent adhesive or film-forming material.

The present invention also provides for monolayer random and ordered arrays of particles and films containing the same made in accordance with the methods disclosed herein.

The specific methods and details of the invention are more fully described below and in the attached drawings.

BRIEF DESCRIPTION OF DRAWINGS

Embodiments of the invention will now be described by way of example. Certain examples are supported by drawings. In the drawings.

DESCRIPTION OF THE INVENTION AND THE PREFERRED EMBODIMENTS

Figure 1:
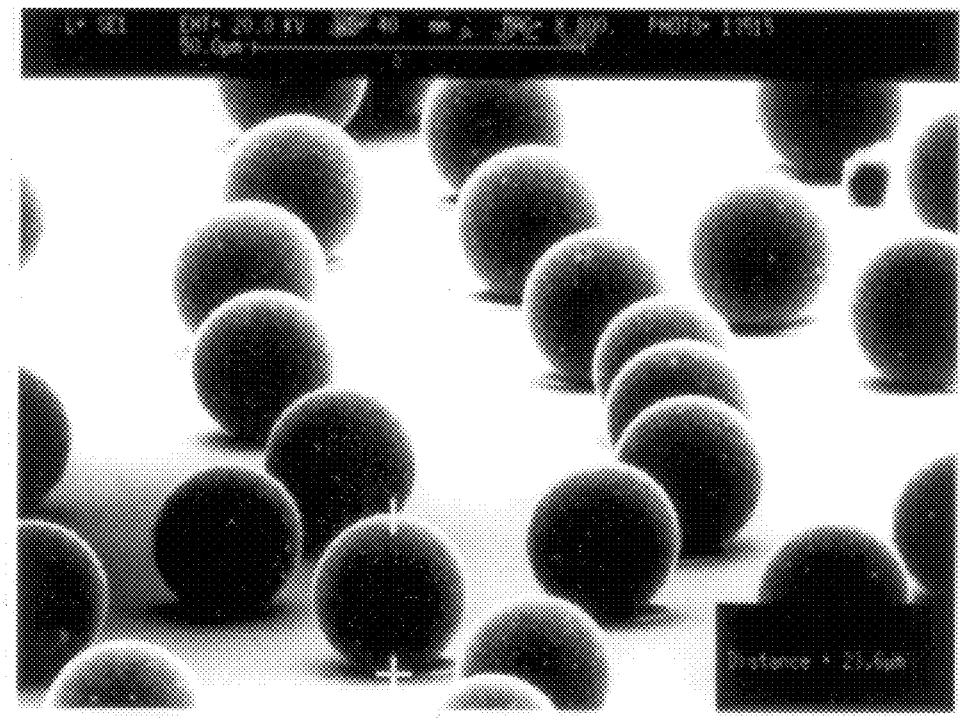
FIG. 1 is an electron micrograph at a magnification×800 of particles having a 25 micrometer diameter on a cured "tack layer" as described in Example 1. The distance between the "+" symbols is 23.6 micrometers.

In accordance with the present invention there is provided:

A. A method of forming a monolayer of particles, said method comprising the steps of:
 (a) applying to a substrate a curable composition having particles contained therein, said particles having a particle size on at least one dimension thereof of at least 1 micrometer;
 (b) exposing the particle-containing curable composition to a source of energy suitable for effecting polymerization of the curable composition for a sufficient time to effect polymerization of a layer of the curable composition having a thickness of no more than 50% of the height of the largest particles; and (c) optionally, removing the uncured curable composition.

The source of energy for effecting cure or polymerization may suitably be a source of electromagnetic radiation or heat, particularly actinic radiation, including ultraviolet (UV), infra red, visible, X-ray or gamma ray, E-beam or microwave. The time of exposure will be chosen by the person skilled in the art, depending upon the energy, the exposure conditions, the depth of cure required, the properties of the curable composition such as its absorbtion of the energy concerned, and the structure confining the composition. In the case of UV light, an exposure for 0.1 to 1 second may suffice. The exposure should be the minimum required to produce a layer or film of cured material to which the particles are anchored. This layer or film is referred to below as the "tack layer" and the tack layer with the particles attached thereto as the "tacked array" both of which are distinguished from, although possibly a part of, the particle containing film, referred to below as the "film", produced in accordance with the methods of the present invention. Additionally, as used herein, the phrases "effecting polymerization" and the "polymerized curable composition" when used in relation to the curable composition is synonymous with "effecting cure" and the "cured curable composition" and vise-versa, respectively.

The particles employed in the practice of the present invention have a particle size of at least one micrometer on at least one dimension thereof and are referred to below as "the substantive particles".

In its various aspects, the invention provides:

B. A method of forming a film having a monolayer of particles contained therein, said method comprising the steps of:
  (a) applying to a substrate a curable composition having particles contained therein, said particles having a particle size of at least one dimension thereof of at least 1 micrometer;
  (b) exposing the particle-containing curable composition to a source of energy suitable for effecting polymerization of the curable composition for a sufficient time to effect polymerization of a layer of the curable composition having a thickness of no more than 50% of the height of the largest particles;
  (c) removing the uncured curable composition;
  (d) applying a film-forming material to fill the interstitial spaces between the particles and optionally to cover areas of the substrate flanking the particles to a film-thickness similar to that of the particle-containing areas;
  (e) optionally, at least partially solidifying the film-forming material; and
  (f) optionally, removing the so-formed film from the substrate.

C. A method of forming a monolayer of particles, said method comprising the steps of:
  (a) applying to a substrate a curable composition having particles contained therein, said particles having a particle size on at least one dimension thereof of at least 1 micrometer;
  (b) exposing the particle-containing curable composition to a source of energy suitable for effecting polymerization of the curable composition for a sufficient time to effect polymerization of a layer of the curable composition having a thickness of no more than 50% of the height of the largest particles;
  (c) optionally, removing the uncured curable composition;
  (d) applying an adhesive film over the surface of the particles, remote from the layer of cured composition, said film having an adhesiveness with respect to the particles greater than that of the cured composition;
  (e) pressing the adhesive film onto the particles;
  (f) separating the adhesive film with the particles adhering thereto away from the layer of cured composition; and
  (g) optionally, removing any substantial amount of uncured and/or cured curable composition remaining on the adhesive film or on the particles adhered thereto.

D. A method of forming a film having a monolayer of particles contained therein, said method comprising the steps of:
  (a) applying to a substrate a curable composition having particles contained therein, said particles having a particle size of at least one dimension thereof of at least 1 micrometer;
  (b) exposing the particle-containing curable composition to a source of energy suitable for effecting polymerization of the curable composition for a sufficient time to effect polymerization of a layer of the curable composition having a thickness of no more than 50% of the height of the largest particles;
  (c) optionally, removing the uncured curable composition;
  (d) applying an adhesive film over the surface of the particles, remote from the layer of cured composition, said film having an adhesiveness with respect to the particles greater than that of the cured composition;
  (e) pressing the adhesive film onto the particles;
  (f) separating the adhesive film with the particles adhering thereto away from the layer of cured composition;
  (g) optionally, removing any substantial amount of uncured and/or cured curable composition remaining on the adhesive film or on the particles adhered thereto;
  (h) applying a film-forming material to fill the interstitial spaces between the particles and, optionally, to cover areas of the adhesive film flanking to the particles to a film-thickness similar to that of the particle-containing areas; and
  (i) optionally, at least partially solidifying the film-forming material.

In the methods A to D above, the particles are preferably dispersed in the curable composition e.g. as a result of mixing of the particles into the composition or by means of dispersion techniques such as described in EP 0 691 660 A1. However some particles may be aggregated in the composition. It is particularly preferred that the particles should be arrayed in the monolayer. The invention in its most preferred aspects therefore provides:

E. A method of forming a monolayer non-random array of particles, said method comprising the steps of:
  (a) applying to a substrate a curable ferrofluid composition having particles contained therein, said particles having a particle size on at least one dimension thereof of at least 1 micrometer;

(b) subjecting the particle-containing curable ferrofluid composition to a magnetic field for a sufficient time to array the particles in a non-random manner in the composition;
(c) exposing the composition having the particles arrayed therein to a source of energy suitable for effecting polymerization of the curable ferrofluid composition for a sufficient time to effect polymerization of a layer of the curable ferrofluid composition having a thickness of no more than 50% of the height of the largest particles; and
(d) optionally, removing the uncured curable ferrofluid composition.

F. A method of forming a film having a monolayer non-random array of particles therein, said method comprising the steps of:
(a) Applying to a substrate a curable ferrofluid composition having particles contained therein, said particles having a particle size on at least one dimension thereof of at least 1 micrometer;
(b) subjecting the particle-containing curable ferrofluid composition to a magnetic field for a sufficient time to array the particles in a non-random manner in the composition;
(c) exposing the composition having the particles arrayed therein to a source of energy suitable for effecting polymerization of the curable ferrofluid composition for a sufficient time to effect polymerization of a layer of the curable ferrofluid composition having a thickness of no more than 50% of the height of the largest particles;
(d) removing the uncured curable ferrofluid composition;
(e) applying a film-forming material to fill the interstitial spaces between the so-formed array of particles and optionally to cover areas of the substrate flanking the particles to a film thickness similar to that in the particle containing area;
(f) optionally, at least partially solidifying the film-forming material; and
(g) optionally, removing the so-formed film from the substrate.

G. A method of forming a monolayer of a non-random array of particles, said method comprising the steps of:
(a) applying to a substrate a curable ferrofluid composition having particles contained therein, said particles having a particle size on at least one dimension thereof of at least 1 micrometer;
(b) subjecting the particle-containing curable ferrofluid composition to a magnetic field for a sufficient time to array the particles in a non-random manner in the composition;
(c) exposing the composition having the particles arrayed therein to a source of energy suitable for effecting polymerization of the curable ferrofluid composition for a sufficient time to effect polymerization of a layer of the curable ferrofluid composition having a thickness of no more than 50% of the height of the largest particles;
(d) optionally, removing the uncured curable ferrofluid composition;
(e) applying an adhesive film over the surface of the arrayed particles, opposite to the layer of cured composition, said film having an adhesiveness with respect to the particles greater than that of the cured composition;
(f) pressing the adhesive film onto the particles; and
(g) separating the adhesive film with the arrayed particles adhered thereto away from the layer of cured ferrofluid composition.

H. A method of forming a film having a monolayer non-random array of particles therein, said method comprising the steps of:
(a) applying to a substrate a curable ferrofluid composition having particles contained therein, said particles having a particle size on at least one dimension thereof of at least 1 micrometer;
(b) subjecting the particle-containing curable ferrofluid composition to a magnetic field for a sufficient time to array the particles in a non-random manner in the composition;
(c) exposing the composition having the particles arrayed therein to a source of energy suitable for effecting polymerization of the curable ferrofluid composition for a sufficient time to effect polymerization of a layer of the curable ferrofluid composition having a thickness of no more than 50% of the height of the largest particles;
(d) removing the uncured curable ferrofluid composition;
(e) applying an adhesive film over the surface of the arrayed particles, opposite to the layer of cured composition, said film having an adhesiveness with respect to the particles greater than that of the cured composition;
(f) pressing the adhesive film onto the particles; and
(g) separating the adhesive film with the arrayed particles adhered thereto away from the layer of cured ferrofluid composition;
(h) optionally, removing any substantial amount of uncured curable composition remaining on the adhesive film or on the particles adhered thereto;
(i) applying a film-forming material to fill the interstitial spaces in the array of particles and optionally to cover areas of the substrate flanking the particles to a film-thickness similar to that of the particle-containing areas;
(j) optionally, at least partially solidifying the film-forming material;

I. A method according to any of A to H above wherein during exposure of the curable composition to the source of energy, a mask is located between the source and the curable composition, the mask having areas that allow passage of the energy and areas that block passage of the energy.

In an alternative embodiment of method I, the substrate upon which the curable composition or curable ferrofluid composition, as appropriate, is applied may have areas that allow for the passage of the energy and areas that block passage of the energy. In this embodiment, the substrate acts as a mask when the source of the energy is on the opposite side of the substrate to the curable composition.

In accordance with the present invention, the curable composition or, curable ferrofluid composition, as appropriate, may be applied to the substrate in a pattern, for example by screen or stencil printing, or may be applied by conventional coating techniques.

In preferred embodiments of the invention, the particles are conductive particles, more particularly electrically-conductive particles, but thermally conductive or optically-transmissive particles may also be used. For convenience, the text of this application is written with specific reference to the use electrically conductive particles and the preparation of electrically conductive films and tacked arrays.

In the method according to any of E to H above the curable ferrofluid composition suitably comprises either:

(a) A colloidal dispersion of ferromagnetic particles in a curable liquid composition (i.e. the curable composition acts as the carrier of the ferrofluid); or (b) a mixture of a curable liquid composition and a colloidal dispersion of ferromagnetic particles in a liquid carrier.

In the method of any of B, D, F and H, the film-forming material may be organic or inorganic and may be selected from thermosets, thermoplastics or both of the foregoing, and preferably is an adhesive material. While the application of a single material is sufficient to manufacture the films in accordance with the present invention, two or more layers of different film-forming materials may be applied to the particles, particularly a first layer of film-forming material which may or may not be adhesive (e.g. an elastomer) and a second layer of adhesive film-forming material, optionally with the additional step of separating the film formed by solidification of the film-forming material with the particles therein away from the layer of polymerized curable composition, the tack layer, and then applying a layer of adhesive material over the so-exposed surface of the film.

One advantageous embodiment of the invention is a bi-layer film comprising a layer of thermoset material and a layer of thermoplastic material. The layer of thermoset material may be either the "tack layer" with a secondary or latent adhesive cure system (B-stage mechanism) therein, or a layer of thermoset backfill material with a thickness not more than 50% of the height of the largest particles. The layer of thermoplastic material is backfill material with a thickness of 50% or more of the height of the largest particles, so that the total thickness of the film is approximately equal to the height of the largest particles. The thermoset layer locks the arrayed particles in position, while the thermoplastic layer can be reworked by use of heat. For example, if the bi-layer film is applied with the thermoset layer adhering to an electronic device and the thermoplastic layer adhering to a printed circuit board, the thermoplastic layer allows a reworking function if the parts need to be disassembled for repair or repositioning or re-use, while the ordering of the arrayed particles is maintained. In a reuse operation, a new layer of thermoplastic material need only be applied to the board, not to the tiny device. Alternatively, if further reusability is not desired, a second thermoset material may be applied instead of the fresh thermoplastic material.

Another advantageous embodiment of the invention is a tri-layer film comprising a layer of thermoset material and two layers of thermoplastic material. In this embodiment, the two thermoplastic layers sandwich the thermoset layer in which the particles are locked and the "tack layer" has been removed. Specifically, after removal of the uncured material a first layer of thermoplastic may be backfilled followed, sequentially by a layer of thermoset material and a second layer of thermoplastic. Alternatively, after removal of the uncured material, a layer of thermoset material may be backfilled followed by a layer of thermoplastic and then the tack layer removed and replaced by a second layer of thermoplastic. This allows for total reworkability and/or recovery of the substrate parts being mated with the film as well as recovery of the film itself.

The total depth of the film is preferably no more than 125%, more preferably 110%, of the height of the largest particles i.e. the dimension perpendicular to the plane of the film. If the film is thicker than the height of the largest particles, the film material should be such as to allow for or facilitate penetration by the particles and/or the elements (particularly conductors) to which the particles are being brought into contact during end use of the film.

Preferably the height of the tack layer is no greater than 25%, more preferably 10%, of the dimension of the largest particles perpendicular to the substrate.

In the preferred embodiments the largest particles (otherwise called "the substantive particles") are of substantially uniform size (monodisperse), preferably having a diameter of at least 2 micrometers. Alternatively, it is possible to employ particles of two or more groups of different sizes but of substantially uniform size within the group of larger size. In accordance with the present invention, the curable composition may also contain one or more fillers having a particle size in the range 0.1 to 1 micrometers.

In the method of either of C, D, G or H the depth of penetration of the particles into the adhesive film is preferably no greater than 25%, more preferably 10%, of the height of the largest particles i.e. the dimension perpendicular to the plane of the adhesive film.

When the particles are of substantially uniform size, the height of the cured layer is measured in relation to the average diameter of the particles. When the term "diameter" is used herein in relation to non-spherical particles, it refers to the dimension perpendicular to the substrate.

In methods B, D, F and H above, film-forming material may be applied to areas flanking the particle-containing areas. Flanking strips of adhesive, which may or may not be the same as the adhesive material in the particle-containing areas, are useful for providing extra strength in a conductive adhesive film. Thus, for example, in edge connection to Liquid Crystal Displays, peel strength is particularly important so that a flexible connection attached to the display does not peel away during its life of operation. It is only necessary that electrical continuity is provided in the area of the material that establishes the edge connection, while the durability of the joint operation is of pivotal importance.

In one embodiment of method A or E, the method includes the further step of forming a solid structure alongside and, optionally, opposite to the monolayer of particles. It is particularly useful to array the particles along a microchannel in a solid structure. Particles coated with a chemical or biochemical agent may thus be located in meandering microchannels which function as micro chromatography columns or patterned test coupons.

The invention in a further aspect provides:

J. A method of forming a monolayer non-random array of particles, said method comprising the steps of:
  (a) applying a composition comprising a ferrofluid composition and particles to a substrate having a surface of adhesive material;
  (b) subjecting the composition to a magnetic field for a sufficient time to array the particles in a non-random manner;
  (c) pressing the particles onto the adhesive surface of the substrate; and
  (d) removing the ferrofluid composition.

K. A method of forming a monolayer non-random array of particles, said method comprising the steps of:
  (a) applying a composition comprising a ferrofluid composition and particles to a substrate which has a surface of latent adhesive material;
  (b) subjecting the composition to a magnetic field for a sufficient time to array the particles in a non-random manner in the composition;
  (c) activating the latent adhesive property of the substrate surface material;

(d) pressing the particles onto the adhesive surface of the substrate; and
(e) removing the ferrofluid composition.

L. A method of forming a film having a monolayer non-random array of particles therein, said method comprising the steps of:
   (a) applying a composition comprising a ferrofluid composition and particles to a substrate having a surface of adhesive material;
   (b) subjecting the composition to a magnetic field for a sufficient time to array the particles in a non-random manner;
   (c) pressing the particles onto the adhesive surface of the substrate;
   (d) removing the ferrofluid composition;
   (e) applying a film-forming material to fill the interstitial spaces between the particles and optionally to cover areas of the adhesive material flanking the particles to a film-thickness similar to that of the particle-containing areas;
   (f) optionally, at least partially solidifying the film-forming material; and
   (g) optionally, removing the so-formed film from the adhesive material.

M. A method of forming a film having a monolayer non-random array of particles therein, said method comprising the steps of:
   (a) applying a composition comprising a ferrofluid composition and particles to a substrate which has a surface of latent adhesive material;
   (b) subjecting the composition to a magnetic field for a sufficient time to array the particles in a non-random manner in the composition;
   (c) activating the latent adhesive property of the substrate surface material;
   (d) pressing the particles onto the adhesive surface of the substrate;
   (e) removing the ferrofluid composition;
   (f) applying a film-forming material to fill the interstitial spaces between the particles and optionally to cover areas of the adhesive surface flanking the particles to a film-thickness similar to that of the particle-containing areas;
   (g) optionally, at least partially solidifying the film-forming material; and
   (f) optionally, removing the so-formed film from the adhesive surface.

In the embodiments of methods J, K, L and M, a conventional ferrofluid composition can be used and it is not necessary to render the composition curable.

In still another aspect of the present invention there is provided:

N. A method of forming a stock wax film containing a monolayer non-random array of particles, said method comprising the steps of:
   (a) applying a composition comprising a ferrofluid wax composition and particles to a substrate;
   (b) elevating and/or maintaining the ferrofluid wax composition at a temperature at or above its melting point;
   (c) subjecting the composition to a magnetic field for a sufficient time to array the particles in a non-random manner;
   (d) cooling the composition to a temperature below its melting point; and
   (e) optionally, removing the wax film from the substrate.

O. A method of forming a monolayer non-random array of particles, said method comprising the steps of:
   (a) applying the wax film prepared in accordance with Method O above to a second substrate having a surface of adhesive material or a surface of latent adhesive material;
   (b) activating the latent adhesive, if present, and elevating the temperature of the wax film and/or the second substrate to a temperature at or above the softening point of the ferrofluid wax;
   (c) pressing the particles onto the adhesive surface of the substrate;
   (e) removing the ferrofluid wax composition; and
   (f) optionally, removing the first substrate if it has not already been removed.

P. A method of forming a film having a monolayer non-random array of particles therein, said method comprising the steps of:
   (a) applying the wax film prepared in accordance with Method O above to a second substrate having a surface of adhesive material or a surface of latent adhesive material;
   (b) activating the latent adhesive, if present, and elevating the temperature of the wax film and/or the second substrate to a temperature at or above the softening point of the ferrofluid wax;
   (c) pressing the particles onto the adhesive surface of the substrate;
   (e) removing the ferrofluid wax composition and the first substrate, if it has not already been removed;
   (f) applying a film-forming material to fill the interstitial spaces between the particles and optionally to cover areas of the adhesive material flanking the particles to a film-thickness similar to that of the particle-containing areas;
   (g) optionally, at least partially solidifying the film-forming material; and
   (h) optionally, removing the so-formed film from the adhesive material.

In the embodiment of methods N, O and P the ferrofluid wax composition comprises a traditional ferrofluid and/or ferromagnetic particles dispersed in a low melting point organic mixture or compound such as waxes; higher molecular weight fatty acids, fatty esters, etc.; rosin; and the like, preferably the waxes. Such modified ferrofluids are referred to below as ferrofluid waxes. These materials are preferably solid or semisolid at room temperature, with melting or softening points of preferably at least 30° C., more preferably at least 40° C. and a melting point of less than 125° C., preferably less than 100° C., more preferably less than 60° C. In step (b) of methods O and P, it may be preferable to elevate the temperature to at least the melting point of the ferrofluid wax so as to facilitate the transfer of the particles and the removal/recovery of the ferrofluid wax composition.

Suitable waxes for use in preparation of the ferrofluid waxes include natural and synthetic waxes with preferred waxes selected from parrafins, ethylenic polymers, polyol etheresters and chlorinated naphthalenes. It is also possible to employ functionalized waxes whereby they become incorporated into the adhesive, latent adhesive or film-forming material. The level of incorporation of the traditional ferrofluid and/or the ferromagnetic particles in the organic mixture or compound is similar to that used in preparing the curable ferrofluids as discussed below. These ferrofluid waxes, however, are generally cheaper and easier to make.

In yet another embodiment, a film having a monolayer non-random array of particles therein may be prepared from methods J, K, and O simply by employing a substrate wherein the adhesive or latent adhesive is a solidifiable film-forming material and the particles are pressed into the adhesive. In this embodiment, the film-forming material is in a liquid or readily penetrable state so as to allow the particles to penetrate into the film-forming material with the film-forming materials filling the interstitial spaces between the particles. Preferably, the thickness of the film-forming material is at least 50% of the height of the largest particles, preferably at least 95% of the height of the largest particles and no thicker than 200% of the height of the largest particle, preferably no thicker than 125% of the height of the largest particle. Most preferably its thickness is from 95% to 105% of the height of the largest particle, most preferably 95% to 100% of the height of the largest particle. In this particular embodiment, the particles are intended to fully or substantially penetrate into the adhesive or latent adhesive material which is a film-forming material. This is in contrast to the prior embodiments wherein the adhesive or latent adhesive is not a film-forming material or is intended only to tack the particles onto the surface thereof particles in which case the particles should penetrate to a depth of no more than 25% of the height of the largest particles.

Obviously, in methods O and P, many variations of the methodology and characteristics of the materials may be made to optimize the process or make it more amenable to the given circumstances. For example, in order to prevent too much intermixing of the ferrofluid wax and the adhesive, latent adhesive or film-forming material, it is preferable to draw off the ferrofluid wax as the particles are pressed into the adhesive, latent adhesive or film-forming material. Alternatively, one may employ an adhesive, latent adhesive, or film-forming material having a viscosity, under the softening or melt temperature of the ferrofluid wax, substantially higher than that of the ferrofluid wax but not so high as to make it difficult for the particles to penetrate the same. Still, it is also possible to optimize the temperature aspects of the processes whereby the adhesive characteristics of the latent adhesive are activated at a temperature just less than, equal to or just greater than the "softening point" or melting point of the ferrofluid wax. As used herein the "softening point" is that temperature at which the ferrofluid wax is sufficiently pliable or flowable under minor pressure to allow for the easy and ready transfer of the particles from the ferrofluid wax to the adhesive, latent adhesive or film-forming material, as appropriate. In yet another aspect, it may be preferred, if feasible, to use the first substrate, i.e., that upon which the wax film is prepared, as a means to press the particles into the adhesive, latent adhesive or film-forming material, as appropriate.

An advantage of the methods J thru P is that the ferrofluid and ferrofluid waxes can be reused or recycled for subsequent reuse in the practice of those methods. Another advantage is that since the ferrofluid is not incorporated into the film, the films can be made transparent or translucent so as to allow for ease of positioning of the formed film on a substrate in its intended end use. This benefit is also attained by methods D and H and may be attained by methods B and F if the tack layer is sufficiently thin or is removed after backfilling.

A film or tacked array formed by a method of the invention may be formed in situ on a substrate on which it will find its end use e.g. an electronic component. In this case, the film or tacked array produced in accordance with the invention forms a coating on the component or other substrate. Thus, the terms "film" and "tacked array" as used herein therefore includes "coating".

In certain embodiments the film may not be required to have adhesive properties, for example, if it is to be used between two sets of conductors which are to be assembled temporarily for test purposes but which are not to be bonded. However generally it is preferred that the film-forming material contains a secondary or latent adhesive/cure system, the secondary or latent adhesive/cure system being activatable in end-use application of the film.

Solidification of the film-forming material (and optionally also the curable "tack layer" composition) generally involves two stages, an A-stage and a B-stage. The A-stage, or primary solidification has the function of producing a film with the particles locked therein which is capable of being handled, either when unsupported or at least when supported. The A-stage may suitably involve a primary cure e.g. by photocure, heat, or E-beam. Solvent evaporation, cooling (in particular from a melt), chemical reaction (e.g. polymerization), physical association phenomena etc., are also acceptable means of effecting viscosity increases to an effectively solid A-staged condition. The B-stage which occurs during end-use application of the film may utilize thermoplastic properties of the A-staged film or coating but preferably involves a cure, for example to a thermoset condition. When the A-stage solidification has been effected by a primary cure, the B-stage cure is a secondary cure which may utilize the same or a different cure mechanism from that of the A-stage.

In one embodiment of methods E–H, the curable ferrofluid composition is applied to the substrate, or in methods J–P, the ferrofluid or ferrofluid wax composition, is then exposed to the magnetic field. In another embodiment, the composition is exposed to the magnetic field while the composition is being applied to the substrate. The composition may be applied continuously or step-wise. Likewise the substrate may pass continuously or step-wise past the apparatus applying the magnetic field.

In one embodiment the composition is applied to the substrate by stenciling or screen printing using stenciling or screen printing equipment having one or more magnets mounted appropriately on it.

The substrate may be rigid or flexible. A release layer may form the substrate and/or may be applied to the tack layer in order to prevent the tack layer from bonding with the film-forming material. Similarly, it may be applied to the surface of the film, remote from the substrate, so as to allow for stacking or rolling of the films. The release layer may be rigid or flexible or may comprise a coating or film of an appropriate releasing compound.

The present invention also related to the monolayered random and ordered arrays of particles and films containing the same produced in accordance with the teachings hereof. It also includes substrates having a film as described above applied thereto or a film or tacked array formed thereon.

The present invention includes an active or passive electronic component having conductors on its surface or periphery and having a film as described above containing electrically conductive particles applied to its conductors or a film or tacked array formed thereon.

According to one aspect of the invention, the film or tacked array may be formed on an electrically addressable substrate such as a silicon wafer comprising circuitry, or conductive glass such as indium tin oxide (ITO)-coated glass which has patternwise delineated conductive tracks thereon. Ceramic, epoxy composite, polyimide films, etc. represent other forms of substrates which may comprise conductive tracks.

In the case of ITO-coated glass substrates, the "tack layer" of the curable composition is suitably rendered susceptible to photopolymerization and is cured by irradiation through the transparent substrate with actinic (UV) radiation. Exposure conditions may be selected such that only a layer of the curable composition actually solidifies. After removal of uncured material, a backfilling material is then applied and cured (primary cure or A-stage).

Alternatively, backfilling is not necessary if a film forming material is to be applied intermediate the ITO-coated glass substrate and the substrate to which it is to be mated at the time of or prior to mating or if the second substrate has a pre-applied coating of a solidifiable film forming material on its surface. In this embodiment, the solidifiable film forming material is in either a liquid or softened or pliable state such that as the parts are mated and pressed together, the particles penetrate through the solidifiable film forming materials until contact is made with the surface of the second substrate.

Similar methods may be applied in the case of substrates which are non-transmissive to UV or visible radiation but which are transmissive to other forms of electromagnetic radiation. The initiator systems in the curable compositions will require modification accordingly. Alternatively a preformed "patch" of film according to the invention is applied to the electrically addressable substrate. In either case, the backfill composition contains a latent thermal hardener or other B-stage cure system so that it has latent adhesive properties. The resulting products can be used for device interconnection to flat panel displays of various types, or direct die attachment, using "flip chip" techniques in the case of a coated and subdivided wafer.

Preferably the average particle size of the substantive particles is at least 10 times that of the colloidal-size ferromagnetic particles, more particularly at least 100 times, most preferably at least 500 times. Most suitably the substantive particles have an average particle size (measured on the minor dimension in the case of non-symmetrical particles) of at least 2 micrometers while the colloidal ferromagnetic particles have an average particle size not greater than 0.1 micrometers, more preferably of the order of 0.01 micrometers.

For electronic interconnection uses, the interconnection pads generally have a width in the range of 10 to 500 micrometers, particularly of the order of 100 micrometers. The separation between the pads generally is less than 150 micrometers, particularly of the order of 100 micrometers. However it is aimed to reduce the separation below 100 micrometers, even down to 10 micrometers or less. The present invention facilitates such pitch or separation reduction.

In the preferred embodiments, the substantive particles are arrayed in a regular pattern in a monolayer. Preferably the thickness of the uncured curable composition on the substrate is regulated (e.g. by compression, squeegee, etc.) before cure to assure that essentially all of the particles (or at least the largest particles) are in substantially the same plane.

Preferably the substantive particles have substantially uniform sizes and shapes. Substantial uniformity is not affected by the presence of some smaller than average particles (which may not function as conductive particles in the film) or some larger than average particles (which may be compressible and/or otherwise capable of size reduction in the conditions of production of the film or coating e.g. solder particles which may melt or deform). The size distribution for solder powder particles is defined according to test methods of the Institute for Interconnecting and Packaging Electronic Circuits, Lincolnwood, Ill. 60646-1705, U.S.A.. For example, under their test method IPC-TM-650, the following distributions are quoted:

TABLE 2B

| | % of Sample by Weight - Nominal Size in micrometers | | | |
| | None Larger Than | Less than 1% Larger Than | 90% Minimum Between | 10% Maximum Less Than 1 |
|---|---|---|---|---|
| Type 4 | 40 | 38 | 38–20 | 20 |
| Type 5 | 30 | 25 | 25–15 | 15 |
| Type 6 | 20 | 15 | 15–5 | 5 |

Preferably in the above-described methods E–H the curable composition is cured or otherwise solidified while the magnetic field is applied or shortly after removal from the field.

In one feature of the invention, pressure may be applied to the layer of film-forming material before and/or during the primary curing or other solidification step.

The substantive particles are preferably compliant when pressed upon, either during preparation of the film, or during its end-use application. This characteristic of compliancy facilitates greater than single point contact and additionally enables small variations in particle size or substrate flatness to be compensated for. This is particularly desirable in the preparation of electrically conductive films.

According to another feature of the present invention, the thickness of the film is substantially equal to or slightly less than the average diameter of the substantive particles. In the event the particles are of two or more groups of different sizes, particles belonging to the group of larger particles will be of substantially uniform size and the thickness of the film will be in relation to the average diameter of that largest group of particles. During exposure to the magnetic field, the thickness of the layer of curable ferrofluid composition may suitably be greater than the average diameter of the substantive particles, preferably not more than twice the said average diameter, so that each particle is surrounded by the carrier liquid and is free to move in the layer of the composition. After backfilling, pressure may be applied to the material to reduce the thickness so that the substantive particles lie at or protrude slightly from both surfaces of the film. Alternatively, if compression is omitted, the thickness of the film may be reduced by shrinkage during the A-stage, e.g. as a result of cure or drying. If the particles are compressible spheres, the thickness of the film may be reduced by compression to less than the average diameter of the electrically-conductive particles so that the particles are compressed into a non-circular cross-sectional shape and the area of electrical contact on the surface of each particle is increased. Compression of individual particles to different degrees of compression may also compensate for some variations in particle size and flatness of the substrate. Electrically-conductive particles having a core of polymeric material coated with an electrically-conductive metal will have a degree of compressibility dependent upon the extent of cross-linking of the polymer. Gold-coated spherical polystyrene particles supplied by Sekisui Fine Chemical Co, Osaka, Japan under the name AU 212, (which were found to have an average diameter of 11.5 micrometers) compressed on the Z-axis under 3.3 MPa pressure were found to have a Z-axis dimension of 10.5 micrometers i.e. an aspect ratio (Z/X) of 0.79 corresponding to an 8.7% contraction on the Z-axis.

Generally, the uniform magnetic field is applied normal to the layer of the curable composition (i.e. in the Z direction)

and the substantive particles form a regular array of particles in a monolayer. With a monolayer there is primarily single-particle bridging in the Z direction between two sets of conductors (when the film is used between two sets of conductors). The regular pattern improves the reliability of electrical contact. In a second embodiment the magnetic field is applied parallel to the layer of the curable composition (e.g. the X direction) and the substantive particles form parallel chains of particles, each in contact with an adjacent particle or particles of the same chain. The chains are formed to lie parallel to the longitudinal axis of two sets of conductor pins or tracks. Here again, single-particle bridging in the Z-direction is achieved between the two sets of conductors but the particles are also in electrical contact with adjacent particles in the same chain so that reliability is further improved. In a case where two separate sets of conductor pins or tracks are located on opposite edges of an integrated circuit or other component, the layer of the composition will normally be interrupted at a central area of the component so that no conductive chain of particles extends across the width of the component to connect the two sets of conductors on the same component (unless in a special case this is desired). In the case of a "quad" component having conductor pins on four edges, with two sets at right angles to the other two sets, the layer of the composition is applied, exposed to the magnetic field and cured in the "tack layer" in two steps, so that chains of conductive particles are formed in the X-direction and Y-direction with the appropriate alignments and interruptions in the respective areas. Screen printing of said composition and/or the use of masks, for example, may facilitate this operation. With the former those areas in which particle chains of one direction are desired are screen printed and cured followed by a second screen printing and cure for particles in the other direction. Alternatively, the same result may be attained by merely masking those areas in which a different direction or orientation of the chains is desired during curing or polymerization of those areas with a first chain direction or orientation, with subsequent curing or the previously masked area.

With the embodiment which uses a magnetic field normal to the layer of the composition, no significant alignment in the X-direction or Y-direction occurs, so that no interruption of the layer of the composition or double alignment step is needed.

The colloidal ferromagnetic particles of the ferrofluid are preferably magnetite but other ferromagnetic particles may also be used as described in U.S. Pat. No. 4,946,613 (Ishikawa), the contents of which are incorporated herein by reference. Exemplary ferromagnetic particles include: (i) ferromagnetic oxides such as manganese ferrites other than magnetite, cobalt ferrites, barium ferrites, metallic composite ferrites (preferably selected from zinc, nickel and mixtures thereof), and mixtures thereof; and (ii) ferromagnetic metals selected from iron, cobalt, rare earth metals and mixtures thereof. A ferrite is a ceramic iron oxide compound having ferromagnetic properties with a general formula $MFe_2O_4$ where M is generally a metal such as cobalt, nickel or zinc (Chambers Science and Technology Dictionary, W. R. Chambers Ltd. and Cambridge University Press, England, 1988). The phenomenon of ferromagnetism is observed in ferrites and similar materials. However they are included within the definition of ferromagnetic particles in this and the parent application.

The ferromagnetic particle diameter may be in the range 2 nanometers to 0.1 micrometers, preferably with a mean particle size of about 0.01 micrometers. The ferromagnetic particle content may suitably comprise from 1 to 30% by volume of the curable ferrofluid composition. In the case where a monomer forms the carrier of the ferrofluid, the suspension of ferromagnetic particles in the monomer may suitably have a particle content of 2–10% by volume.

A surfactant will generally be required for producing stable dispersions of the ferromagnetic particles in the carrier, particularly in curable carriers. Surfactants may be selected from unsaturated fatty acids and salts thereof wherein the fatty acid or salt has one or more polar groups such as COOH, $SO_3H$, $PO_3H$ and mixtures thereof, or other surfactants well known in the art such as silicone type surfactants, fluorine type surfactants and the like. Suitable surfactants include Sodium oleate, or oleic acid, silane coupling agents such as that available under the Trade Mark SH-6040 from Toray Silicone Co. Ltd., Saloosinate LH from Nikko Chem. Co. Ltd, the fluorine containing surfactant X C95-470 from Toshiba Silicone Co. Ltd.. Primary surfactants form an adsorbed coating on the surface of the ferromagnetic particles. In some circumstances a secondary surfactant may also be required, to achieve satisfactory dispersion, particularly an anionic surfactant, for example an acid form of a phosphate ester, particularly an aromatic phosphate ester type surfactant such as GAFAC RE610 from GAF (Great Britain) Limited, Wythenshawe, Manchester, U.K. or RHODAFAC RE610 from Rhone-Poulenc, Chimie, France.

Traditional ferrofluid compositions comprise colloids of the ferromagnetic particles in a suitable non-magnetic carrier liquid. Such non-magnetic carrier liquids may be chosen from among those described in U.S. Pat. No. 4,946,613 Ishikawa, U.S. Pat. No. 3,843,540 Reimers or WO 95/20820 of the present Applicants, the contents of which are incorporated herein by reference. The carrier may suitably be an organic solvent selected from (a) hydrocarbons such as liquid fractions of intermediate boiling range such as kerosene and fuel oils, n-pentane, cyclohexane, petroleum ether, petroleum benzine, benzene, xylene, toluene and mixtures thereof; (b) halogenated hydrocarbons such as chlorobenzene, dichlorobenzene, bromobenzene and mixtures thereof; (c) alcohols such as methanol, ethanol, n-propanol, n-butanol, isobutanol, benzylalcohol and mixtures thereof; (d) ethers such as diethyl ether, diisopropyl ether and mixtures thereof; (e) aldehydes such as furfural and mixtures thereof; (f) ketones such as acetone, ethyl methyl ketone and mixtures thereof; (g) fatty acid such as acetic acid, acetic anhydride and mixtures thereof and derivatives thereof; and (h) phenols, as well as mixtures of the various solvents. Reviews on ferrofluids have been provided by various authors (Ferromagnetic Materials, Wohlfarth E. P. (Ed), Vol 2 Chpt 8, p509—Charles S. W. and Popplewell J., North Holland Publishing Co. 1980; Aggregation Processes in Solution, Wyn-Jones E., Gormally, J. Chpt 18, p509, Martinet A Elsevier Sci. Publishing Co. 1983; Rosensweig R. E. Ann. Rev. Fluid Mech. 19, 437–463, 1987). Commercially available ferrofluids such as those from Ferrofluidics Corp. N.H., U.S.A. comprise dispersed magnetizable particles in suitable carriers, the most common of which are water, esters, fluorocarbons, polyphenylethers and hydrocarbons.

Typical properties of standard ferrofluids and further characteristics of exemplary ferrofluids are given in the parent application.

The ferrofluids are normally effective insulators. The resistivity of a ferrofluid adhesive composition is likely to be further increased after curing. If desired, a small percentage of an electrically-conductive filler such as carbon or metallic powder may be included in the ferrofluid (see EP A 0 208 391) so that in an embodiment in which the "tack layer" remains in the final product and covers the lower surface of the electrically-conductive particles, conductivity is ensured by the filler which would itself be ordered in the manner of "magnetic holes". The loading of additional conducting filler in the "tack layer" is chosen such that electrical continuity does not persist in the plane of the "tack layer" for distances greater than a few micrometers at most.

As mentioned previously, the curable ferrofluid composition is preferably an adhesive composition and may be any suitable monomer composition into which the colloidal ferrofluid can be mixed or in which the ferromagnetic particles can be dispersed to form a colloid. Numerous polymerizable systems based on acrylate, epoxide, siloxane, styryloxy, vinyl ether and other monomers, oligomers, pre-polymers such as polyimides and cyanate ester resins and/or polymers and hybrids thereof may be used as the curable "tack layer" composition and/or as the film-forming material. Traditional anisotropically conductive adhesive films have for example been described by Emori and Tasaka in WO 93/01248 based on cyanate ester resins in conjunction with thermoplastic resin additives. The adhesive may be selected from olefinically unsaturated systems such as acrylates, methacrylates, styrene, maleate esters, fumarate esters, unsaturated polyester resins, alkyl resins, thiol-ene compositions, and acrylate, methacrylate, or vinyl terminated resins including silicones and urethanes. Suitable acrylates and methacrylates are those used in polymerizable systems such as disclosed in U.S. Pat. No. 4,963,220 of Bachmann et al and U.S. Pat. No. 4,215,209 of Ray-Chaudhuri et al. Also preferred are methylmethacrylate, polyfunctional methacrylates, silicone diacrylates and polyfunctional acrylated urethanes of the type known to be useful in formulating adhesives (e.g. as disclosed in U.S. Pat. No. 4,092,376 of Douek et al) or a thiol-ene or thiol-nene (e.g. as disclosed in U.S. Pat. Nos. 3,661,744, 3,898, 349, 4,008,341 or 4,808,638). Suitable epoxy systems are included among those described in "Chemistry and Technology of Epoxy Resins", ed. B. Ellis, Blackie Academic and Professional, 1993, London, Chapter 7 P.206ff. F. T Shaw. Suitable Styryloxy systems are as disclosed in U.S. Pat. Nos. 5,543,397, 5,084,490 and 5,141,970. The contents of all the above-mentioned patents and text are incorporated herein by reference. In the case wherein the solidification process exploits the resolidification of a molten matrix material, suitable matrices include polyamide hot melt adhesive polymers, Uni-Rez(R) 2642 and Uni-Rez(R) 2665, which are commercially available from Union Camp Corporation in Savannah, Ga., and polyester polymers, Vitel(R) 1870 and Vitel(R) 3300, which are commercial available from Shell Chemical Co in Akron, Ohio. These materials have been disclosed by Mathias U.S. Pat. No. 5,346,558 in traditional solderable anisotropically conductive compositions and methods for using the same. One proviso applied to the adhesive system for the "tack layer" is that it is either compatible with a commercially available ferrofluid or else is capable of acting as a carrier for the suitably treated magnetically polarizable particles which are used in the making of a ferrofluid.

The curable "tack layer" composition, like the film-forming composition, may be one that undergoes a one-step or two-step cure or solidification (or is reversibly solidifiable). In the first step the tack layer is sufficient to adhere and lock in place the particles. In the second step, particularly where it is desired to adhere the so formed tacked array or film to a substrate, a full cure or solidification or resolidification is attained. Such a result could be achieved by use of curable compositions comprising two or more polymerizable systems, a primary cure system and a secondary or latent cure system, or monomers which have two or more reactive or functional groups thereon, e.g., an epoxy acrylate.

As mentioned previously, suitable solidifiable backfilling or film-forming materials may be organic or inorganic and solidification may be attained through a number of mechanisms. Preferred backfilling materials are organic, preferably thermosets or thermoplastics, the latter including conventional "commodity" thermoplastics such as polyolefins, polystyrene and polyvinylchloride as well as the "engineering" thermoplastics such as polyalkylene terephthalates, polycarbonates, polyetherimides, polyphenylene ethers, polyetheretherketones, etc. Thermoset materials include, but are not limited to the materials discussed above as suitable for the tack layer, absent, of course, the ferrofluid or ferromagnetic particles, as appropriate. Cure or polymerization of the film-forming materials may be attained by free radical, anaerobic, photoactivated, air-activated, cationic, anionic, heat-activated, moisture-activated, instant or other cure systems such as the addition of hardeners to resins. One cure system may be utilized in the A-stage or primary solidification, and a second cure system may be utilized in the B-stage. Those skilled in the art will also immediately appreciate and recognize other curable or solidifiable monomers, oligomers, pre-polymers and polymer materials and systems which can be employed as the film-forming material.

Backfilling may be accomplished by merely pouring or dispensing the film-forming material onto the tacked layer or the adhesive film. Additionally, the backfilling may be accomplished by squeegeeing the film-forming material onto the tacked layer or adhesive film. Alternatively, backfilling may be accomplished by pressing together a carrier film or substrate having a layer of film-forming material disposed thereon, the film-forming material being in a liquid or readily penetrable state, and a tacked array or an adhesive film with the particles disposed thereon, so as to allow the particles to penetrate to a depth of at least 50% of the height of the largest particles, preferably at least 95% of the height of the largest particles. In this embodiment the layer of film forming material is preferably no thicker than 125% of the height of the largest particle and is more preferably of a thickness of from 95% to 110% of the height of the largest particle, most preferably from 95% to 100% of the height of the largest particle. Obviously, these ratios will vary depending upon the depth to which the particles penetrate the tack layer or adhesive film. After cure or A-stage cure, the carrier film or substrate may be removed or it may be removed just prior to use of the so-formed film in its intended end-use application. Alternatively, the carrier film may be a latent adhesive or have a layer of adhesive or latent adhesive material on the face opposite the film-forming material so that in use, the adhesive or latent adhesive is activated to bond the film to a second substrate and the carrier film itself sufficiently pliable or penetrable to allow the particles to penetrate therethrough in assembling a device, particularly an electronic device, with the film.

The monomer composition may comprise two polymerizable systems, one of which cures wholly or partially in the A-stage or primary solidification, and the second of which cures in the B-stage (accompanied by further curing of the first system, if appropriate). Alternatively or additionally, the monomers themselves may be hybrids having more than one reactive or curable functionality, for example an epoxy acrylate, may be used.

The substantive particles may be magnetic; although the magnetic field will be applied directly to such particles, the presence of the ferrofluid contributes to a more structured pattern of aligned magnetic electrically-conductive particles than would be achieved if the particles were dispersed in a composition without the ferrofluid. Depending upon the end-use application of the products of the present invention, the particles may be conductive or non-conductive. Preferably the particles are conductive, whether thermally or electrically conductive or optically transmissive. Those skilled in the art will readily recognize the applicability of this invention to most any particle and will readily identify and select the appropriate particles for the intended result, i.e., for example glass or transparent/transluscent polymer particles for optical transmission; carbon, carbon black, alumina, zinc oxide, magnesium oxide and ferric oxide for thermal conductivity; and silver, copper, gold, nickel, etc. for electric conductivity. Alloy particles, especially solders, may also be used as electrically conductive particles. U.S. Pat. No. 5,346,558 (Mathias) describes solder powder whose particle size is less than 37 micrometers and preferably less than 15 micrometers. WO 93/1248 Emori et al describes a superfine solder powder, average diameter 10 micrometers available from Nippon Atomizer.

However, for electronic applications, especially for electrical conductivity, the substantive particles must be electrically conductive and, as a preferred feature, substantially non-magnetic. The term "non-magnetic" as used herein means that each particle has no significant net magnetic dipole. A particle with a non-magnetic core may have a coating of a metal (such as nickel) which is ferromagnetic in nature but in view of the small volume of the coating the net magnetic moment per unit volume of the particle is not significant. The substantially non-magnetic particles do not respond to magnetic fields in environments which themselves are not susceptible to magnetic fields, for example a non-ferromagnetic liquid medium. Suitable particles may be of wholly conductive materials or they may have a non-magnetic non-conductive core, for example of plastics material such as polystyrene, or of glass, coated with an electrically-conductive metal such as nickel, silver or gold. A core of conductive material such as graphite or a metal may also be used. Alternatively, the core may optionally be hollow, for example a hollow glass sphere with an outer coating of a conductive material. Particles of carbon fibre or solder may also be used.

The substantive particles may suitably have a size in the range 1–300 micrometers. Spherical particles are preferred but other spheroidal shapes, elongated shapes, cylindrical shapes, regular shapes such as cubic, or fibrous structures may also be used. For spherical particles a diameter in the range 2–100 micrometers, more particularly 2–50 micrometers, especially 5–30 micrometers and more especially 5–20 micrometers, is preferred, while for particles having a major dimension and a minor dimension the major dimension is preferably in the range 2–300 micrometers and the minor dimension is preferably in the range 2–100 micrometers, particularly 2–50 micrometers, especially 5–30 micrometers, and more especially 5–20 micrometers the aspect ratio preferably being in the range 15/1 to 1/1, more preferably 10/1 to 1/1. In the case of fibrous structures an aspect ratio of up to 50/1 may be acceptable but fibres are less preferred because of the danger of cross-contact causing incorrect interconnection between conductors, particularly in a thin layer of composition unless the fibres are of substantially uniform length (e.g. in the form of cylinders) and these are arrayed so that their long axes are orthogonal to the substrate.

Application of a magnetic field to the ferrofluid composition causes interactions between the colloidal ferromagnetic particles and the non-magnetic substantive particles so that they are mutually stabilized in a non-random structural pattern (with chain formation where the appropriate dimension of a layer of the composition so permits) due to attractive interactions between particles and repulsive interaction between chains (see Skjeltorp, Physical Review Letters, Op.cit.).

The concentration of substantive particles in the composition is chosen according to the desired spacing between those particles in the ordered array and other factors. With spherical particles of about 2 micrometers diameter, a concentration in a monolayer of 107 particles per square centimeter may be suitable. A qualitative concentration in the range 0.5–60%, by weight of the composition may also be suitable. (see U.S. Pat. No. 5,366,140, the contents of which are incorporated herein by reference, particularly at column 2 lines 24–28 which describes average densities of about 600–6,000,000 microbeads/cm$^2$, most preferably 160,000–6,000,000 beads/cm$^2$).

Optimum concentrations of substantive particles depend upon a number of factors that can be determined by those skilled in the art through simple experimentation and/or mathematical calculations. Skjeltorp (U.S. Pat. No. 4,846,988) notes that the concentration of magnetic holes in ferrofluids polarized with a magnetic field, determines the distance between them. Shiozawa et. al. (1st International Conference on Adhesive Joining Technology in Electronics Manufacturing, Berlin, November 1994) indicates that contact resistance in traditional anisotropically conductive adhesives decreases as particle count (per unit area) increases. The larger the number of conductive particles, the greater the current carrying capacity. The current carrying capabilities are not only concentration dependent but also particle type dependent (Lyons and Dahringer in "Handbook of Adhesives Technology", Pizzi and Mittal (eds), Marcel Dekker Inc 1994, p. 578).

Thus the actual concentration of conductive particles will depend on the particle type, density, diameter, electrical pattern, minimum required contact resistance measurements, the spacing between opposing and adjacent conductors, the surface area of the conductors, etc.

Li and Morris (1st International Conference on Adhesive Joining Technology in Electronics Manufacturing, Berlin, November 1994) have developed computer programs that calculate the minimum pad size for different loading densities and the minimum pad space for different particle sizes of conductive particles in conductive adhesives. In ordering the array of particles, the magnetic field may be applied by a permanent magnet or by electromagnetic means. A preferred magnetic field is in the range 10 mT to 1000 mT, more preferably 10 mT to 100 mT, applied for a time in the range 0.1 to 10 minutes, more preferably 0.5 to 5 minutes. The magnetization saturation of the ferrofluid composition will influence the selection of the magnetic field strength.

Films or coatings according to the present invention containing electrically-conductive particles are intended inter alia for use in electrical interconnection of active and/or passive electronic components, for example chip-on-board, chip-on-flex, chip-on-glass and board/flex and flex/glass. The invention is particularly suited for interconnection of fine-pitch sets of conductors and for "flip-chip" technology.

A further feature of the present invention is a product in the form of the tack layer following removal of the particles therefrom. In one method of making this product, the tack layer, free of particles, is inherently produced as a result of the separation of an adhesive film with the particles adhering thereto away from the layer of cured curable composition or cured curable ferrofluid composition in the method C or G above, respectively. This product comprises a layer of cured composition having apertures or recesses therein corresponding to the locations of (preferably arrayed) particles.

In another aspect the invention provides an adhesive film having recesses in the adhesive surface layer thereof, produced as a result of removal of particles formerly adhered thereto in the method C or G above. Preferably the removal of particles from the adhesive film has been effected by applying to the particles a second adhesive film having an adhesiveness with respect to the particles greater than that of the first adhesive film. Alternatively the recesses may be created in the second adhesive film by removal of the particles therefrom by applying a third adhesive film having even stronger adhesiveness with respect to the particles than the second adhesive. This procedure can be repeated in a mastering operation from one adhesive film to another with greater adhesiveness. The adhesive film(s) are preferably pressure sensitive adhesive tape(s).

The array of craters in the first (or subsequent) adhesive film may be of higher quality than that in the cured "tack layer" because of possible roughness in the "tack layer" after removal of uncured curable composition.

In a further alternative, the particle array on the first adhesive film can be used as a master to create a pattern by stamping, or the like, into a substrate capable of producing a smooth surface and retaining the shapes of the recesses created by the particles.

The recesses or "craters" may be circular in outline, or may have non-circular shapes such as squares or hexagons, depending upon the cross-section of the particles. The craters may have a parabolic or flat base, depending upon the shape of the particles.

The crater arrays may be overcoated with a thin layer of moldable material such as metal, for example to make a reflector array of parabolic mirrors, or glass, for example to make waveguides with geodesic optical elements incorporated thereon.

A further feature of the invention is a film having apertures therein corresponding to the locations of (preferably arrayed) particles, produced by removing particles from a film produced by the method C, D, G or H above. The particles may, for example, be removed from the film by treatment with a solvent which dissolves the particles but not the film e.g. THF or acetone for dissolving polystyrene spherical particles.

The cratered array may also be prepared from other backfill materials including ceramics or metallics, or highly resistant polymers. Particles may be removed by dissolution, pyrolysis etc. to leave voids in an arrayed configuration in the film, which may be useful for example in membrane applications, mastergrid applications for displays or display elements, confining other species such as liquid crystals, photochromic materials, dyes, photosensitive or emissive materials, or for vibrating plate orifice devices for aerosol production (Berglund R. N. et al., Environmental Science and Technology, 1973, Volume 7 Number 2, pg. 147.).

In another aspect, the invention provides a method of making an assembly of two components which comprises forming a monolayer of particles in a cured layer of curable composition according to method A or E, removing the uncured curable composition, bringing the second component into contact with the particles, and applying a fluid adhesive material into the space between the components and optionally over the assembly. The method is particularly suitable for forming a "globbed" assembly of an electronic device onto a substrate such as a board. The cured "tack layer" with the particles arrayed therein is created on the substrate and the device is assembled onto the particle array. It may optionally be held in position by a "chipbonder" adhesive in small quantities, or the particles themselves may be adhesive properties e.g. as described in the first parent application. The assembly may then be "globbed" and underfilled simultaneously by applying adhesive over the device and into the space between the two components including the interstitial space between the particles. This method maximizes electrical contact and environmental protection for the particles.

The following examples serve to provide further appreciation of the invention but are not meant in any way to restrict the effective scope of the invention.

In the Examples, the following abbreviations are used:

Ms=Magnetization saturation

G=Gauss

T=Tesla cPs=centipoise ($10^{-3}$ $Nm^{-2}s$)

EXAMPLE 1

A curable ferroadhesive composition was prepared from the formulation described below:

| Reference Number | Component | Percent w/w |
|---|---|---|
| 1 | Epoxy-Acrylate, resin IRR 282, ucb Chemicals, Drogenbos, Belgium | 36.71 |
| 2 | Bisphenol F. Dow, US | 10.84 |
| 3 | Irgacure 1700, Ciga-Geigy, UK | 3.85 |
| 4 | Butane diol diacrylate | 26.92 |
| 5 | DICY (dicyandiamide) | 5.24 |
| 6 | Benzyl dimethylamine | 0.35 |
| 7 | Au-coated spheres, Sekisui KK, Osaka, Japan | 16.08 |

In order to optimize viscosity and magnetic strength of the formulation, item 1 was derived from an IRR282 based ferrofluid ($M_s$ 115 G; viscosity at 27° C. of 115 cPs) and 29.8% of item 4 was derived from a butane diol diacrylate based ferrofluid ($M_s$ 116 G; viscosity at 27° C. of 12 cPs). The ferrofluids were prepared by Liquids Research Limited, Unit 3, Mentech, Deinol Road, Bangor, Gwynedd, U.K.

The residual balance of item 4 was derived from pure butane diol diacrylate monomer. The formulation formed a stable colloid when all ingredients were admixed. The magnetic strength of the resulting low viscosity formulation was approximately 50 G. The gold-coated spheres were either exclusively 12, or exclusively 25 micrometers in diameter.

This particle-containing ferroadhesive composition was applied to a microscope slide and confined by placing a glass cover slip on top of the liquid formulation. The liquid film was squeezed gently with even pressure to give a uniform film which was less than two particle diameters in thickness. The sample was poled in a Halbach magnetic cylinder with a uniform magnetic field of 0.6 T for approximately 30 seconds at room temperature (approx. 26° C.). The field direction was perpendicular to the substrate plane. The sample was removed from the poling field and irradiated with UV light from the microscope slide side for 0.2 of a second. The glass cover slip was then prized off with a blade and the upper portion of the sample was seen to be in a substantially uncured liquid form. Inspection under the microscope however revealed that an ordered particle array was still intact following the delamination of the top cover slip, and the gold particles were completely uncovered by material. There was nevertheless some free liquid material still surrounding the particles. The free liquid material was washed from the sample with a jet of acetone. Washings were coloured with ferrofluid. The sample was re-examined under the microscope to reveal an intact array of bright gold particles on a dry surface. No trace of liquid material was observed in the particle interstitial spaces. Electron microscopy revealed that a 23.6 micrometers of a 25 micrometer diameter particle was standing proud on a cured layer of the ferroadhesive composition as shown in FIG. 1 i.e. the cured layer had a thickness of 1.4 micrometers which is 5.6% of the diameter of the particles. This distance could be controlled by adjusting parameters relating to the absorption of the ferrofluid composition, the confining structure and the illumination conditions.

The array of ordered particles standing proud on the surface was backfilled with film-forming adhesive of the composition tabulated above i.e. of identical composition to that from which the ferroadhesive was derived except that it contained no magnetite nor ingredients necessary to disperse same. The backfilling material filled the interstitial spaces between the particles. This backfilled system was confined by a cover slip and again irradiated from the slide side, now for ten seconds, to invoke an A-stage cure as described in the second parent application, Example 7. The A-staged film was peeled free from confining cover slip and substrate sequentially and used in electrical and mechanical tests.

Mechanical testing involved bonding a 36 mm$^2$ silicon die onto an FR4 substrate with the above-mentioned film. The bonding conditions (B-stage cure) for both the backfill and the "tack layer" were: 90 seconds, 100N, and approximately 180° C. in the bondline. The sample was left for one hour at room temperature before die shear testing. Die shear strengths averaging 13 mPa were recorded. Typical values obtained in identical tests for pure ferroadhesives were around 4 mPa.

Electrical testing of the sample prepared according to the invention showed Z-axis contact resistance of 350 mOhms. The backfilling material was an electrical insulator with contact resistance in excess of 200 kOhms.

EXAMPLE 2

Figure 2:
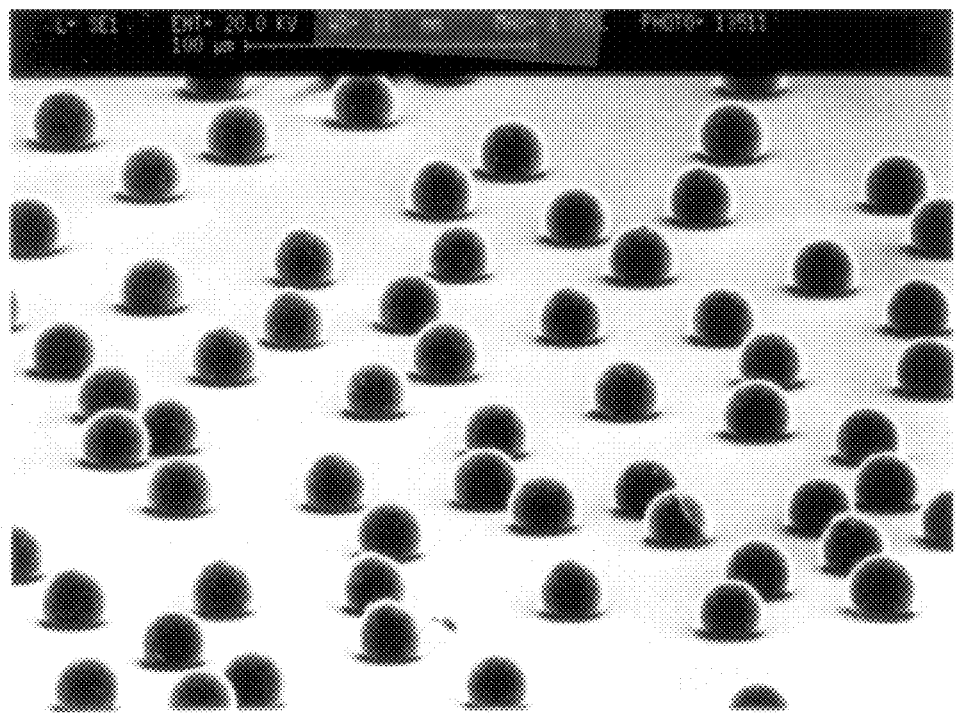
FIG. 2 is an electron micrograph at a magnification×350 of similar particles transferred to a pressure-sensitive adhesive tape as described in Example 2.
Figure 3:
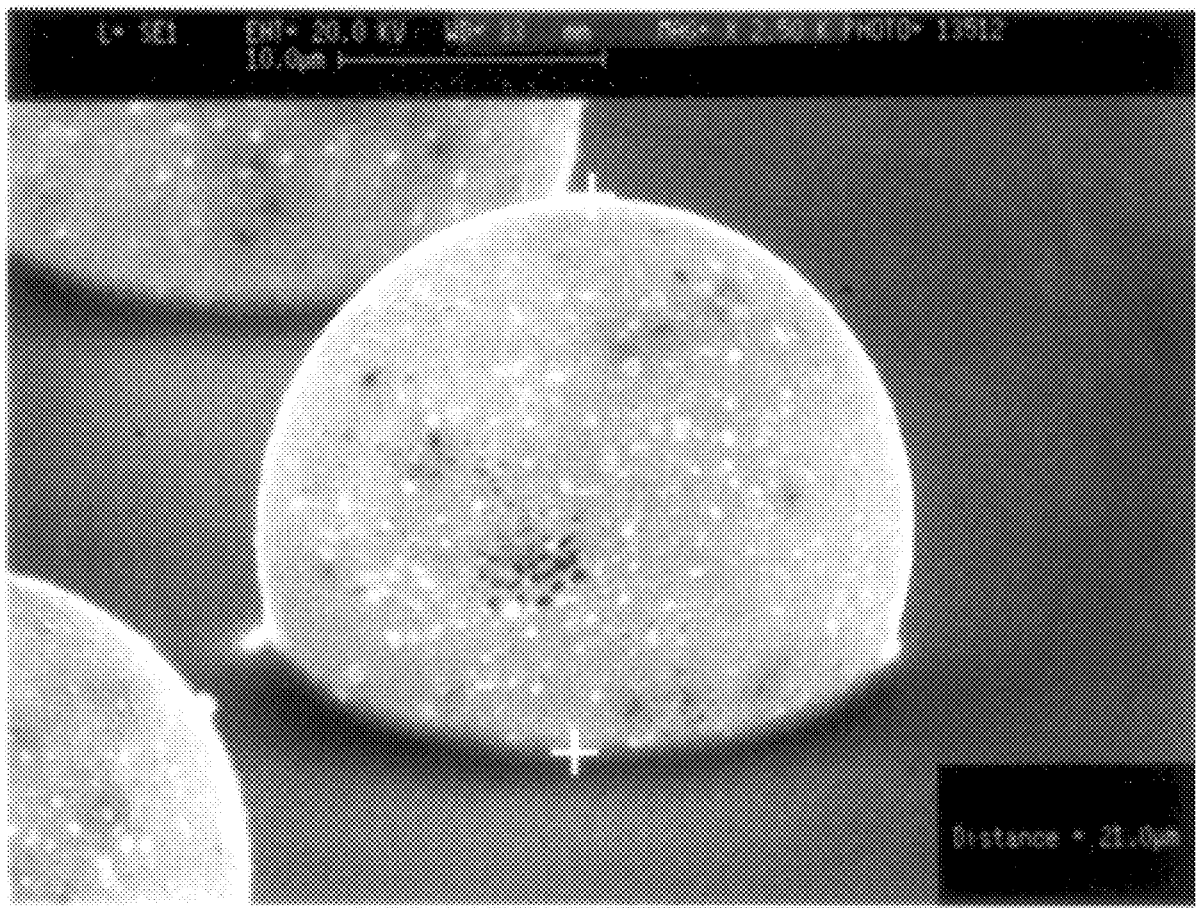
FIG. 3 is an enlarged view at a magnification×2,500 of similar particles to those of FIG. 2, showing in particular one of the particles embedded in the pressure-sensitive adhesive.
Figure 4:
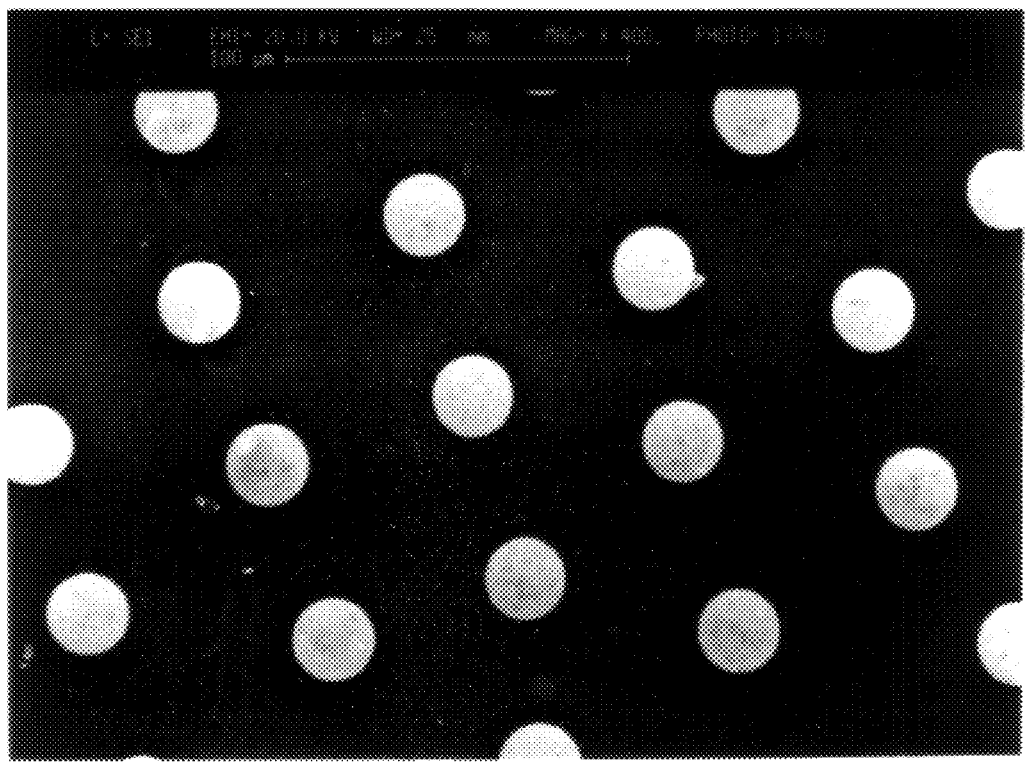
FIG. 4 is an electron micrograph at a magnification×400 of particles on a cured "tack layer".
Figure 5:
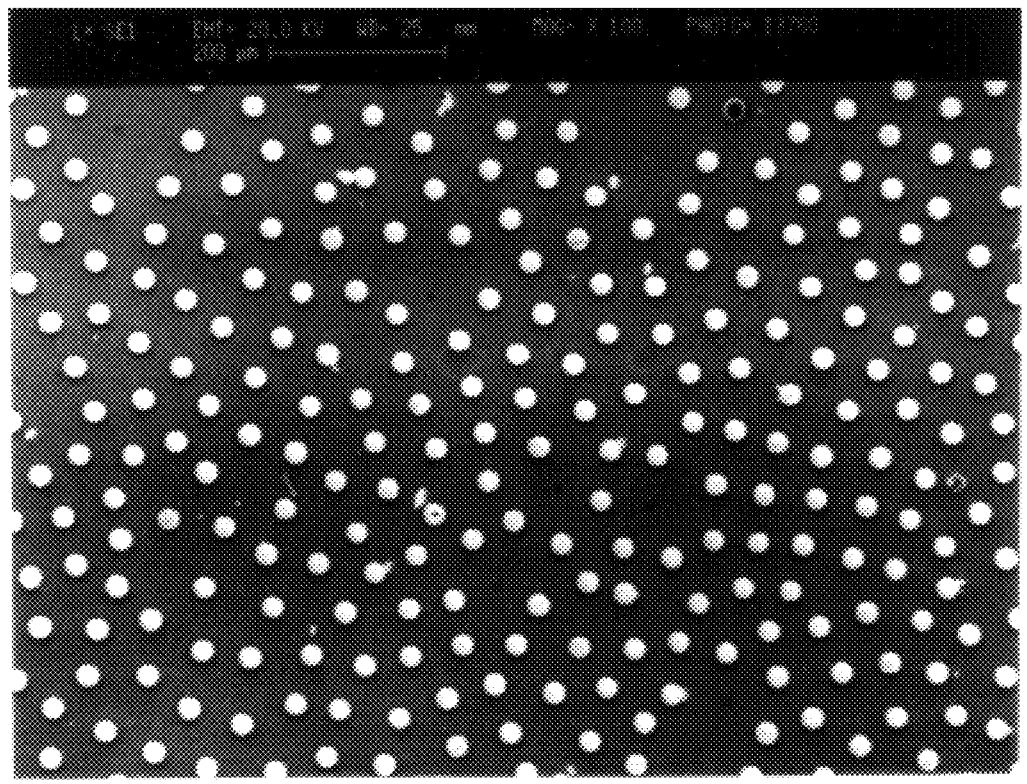
FIG. 5 is an electron micrograph at a magnification×100 of the same cured "tack layer".

An identical experiment to that described in Example 1 was conducted up to the point where the ordered array was washed and left adhering to a cured layer of the ferroadhesive composition. Next a commercially available pressure sensitive adhesive (PSA) tape (Sellotape—registered trade mark) was used to transfer the ordered array of particles from the cured ferroadhesive layer directly on to the PSA while retaining order as shown by electron microscopy and illustrated in FIGS. 2 and 3. In this way the particles were set free from the cured ferroadhesive layer or tack layer. The top of the spheres shown in FIG. 2 corresponds to the bottom, or tacked portion, of the spheres shown in FIG. 1. Depending on the applied pressure the particles may be transferred into the PSA to different depths. FIG. 3 shows a 25 micrometer sphere embedded to a distance of 4 micrometers in the PSA. The particles supported on the PSA were backfilled and part cured (A-stage) in the same way and to the same effect as described in the previous example. The siliner on the PSA tape was removed for test purposes, but otherwise supported the films and facilitated handling. The transfer operation left behind an array of craters in the ferroadhesive layer or tack layer remaining on the substrate. This ferroadhesive layer with the array of craters therein could be used for other purposes.

EXAMPLE 3

Since the function of the ferroadhesive composition is to order and tack particles, it is not necessary that this material be formulated to impart dual stage cures or any specific strength characteristics. However it is advantageous if the ferroadhesive adheres better to the substrate than to the backfilled matrix of film-forming material. To this end acrylic acid was admixed with the commercially available ferrofluid APG 511A (Ferrofluidics Inc., N.H., U.S.A.) in a 1:1 mix together with some 10% of photoinitiator IC 1700 (Ciba-Geigy, UK) (cf. WO 95/20820 Examples 18–19). This produced a polymerizable fluid with a magnetic saturation of almost 90 G and with a viscosity considerably less than 40 cPs at room temperature (APG 511A alone has a room temperature viscosity of 40 cPs, whereas acrylic acid is of lower viscosity) which was extremely responsive to a magnetic field and capable of ordering included magnetic holes (i.e. particles) in one to three seconds at room temperature. Various other ratios of acrylic acid and APG 511A were used to get greater magnetic strength or greater polymerization. Ordered arrays were established by the means described in Example 1 (photocure for 0.2 seconds). The ordered particles were washed on the cured polyacrylic acid layer with acetone and the tack layer remained intact.

The skeletal array of particles was backfilled with the non-ferroadhesive equivalent of the curable composition tabulated in Example 1. The backfilled adhesive was cured for ten seconds as previously described (A-stage) and stripped free from the cured polyacrylic acid film layer which remained tenaciously adhered to the substrate due to its rich polar structure. The free standing test film was completely transparent and uncoloured by ferrofluid and comprised an array of bright gold spheres. This was subjected to mechanical and electrical testing according to the methods already described. Mechanical testing showed die shear strengths of 10 mPa and electrical testing showed a Z axis contact resistance of some 500 mOhms. The backfilled matrix without particles was an electrical insulator.

EXAMPLE 4

A commercial double-sided PSA tape (Sellotape— registered trade mark) was used to prepare a test substrate. One side was adhered to a glass microscope slide and the other side which faced upwards was stripped of its siliconized backing film. A commercially available (non-polymerizable) ferrofluid (APG 511A from Ferrofluidics Inc, N.H., U.S.A.) containing 25 micrometer Au-coated uniform plastic spheres at approximately 10% w/w was prepared and applied on top of the PSA tape. A siliconized release paper was gently placed on top of the ferrofluid droplet taking care not to press so much that particles became stuck to the PSA before ordering. This was achieved by placing a glass cover slip on top of the siliconized paper to function as a low mass weight which would exert pressure over a given area. The sample was poled in a uniform magnetic field as described in the second parent application. After poling for one to three seconds the sample was removed and pressure was uniformly applied to the assembly to drive the particles onto the PSA surface. The siliconized paper was removed and the sample was washed free of ferrofluid with a brief acetone wash. Optical inspection revealed that an array of ordered particles remained on the PSA which could be backfilled by the method described in the previous examples.

To supplement the disclosure herein, reference is directed to the content of the second parent application i.e. U.S. patent application Ser. No. 08/686,987 filed entitled "Films and Coatings Having Anisotropic Conductive Pathways Therein" claiming priority from Irish Patent Application No. 950589 dated Aug. 1, 1995, the contents of which are incorporated herein by reference. The following pages reproduce the Brief Description of Drawings and the Description of the Preferred Embodiments from the said second parent application.

BRIEF DESCRIPTION OF SUPPLEMENTARY DRAWINGS

Figure 6:
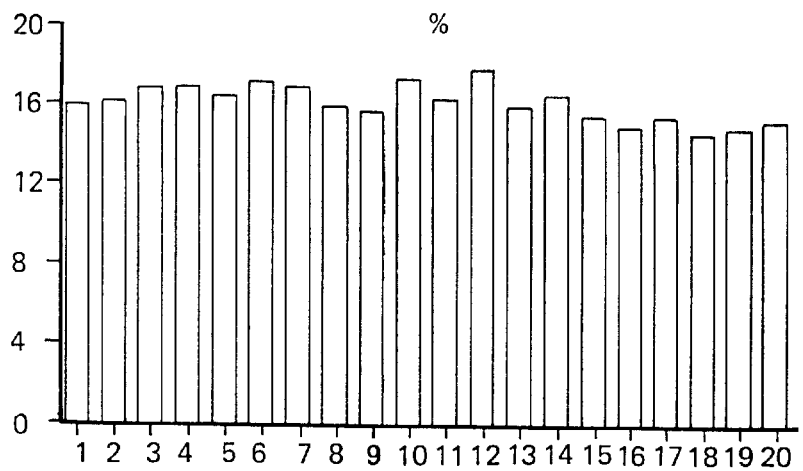

Embodiments of the invention of the second parent application will now be described by way of example. Certain examples are supported by drawings. In the supplementary drawings:

FIG. 6 is an image analysis (20 optical fields, 100× magnification) of photocured ferrofluid film containing gold-coated polystyrene spheres of 11 micrometer diameter (Example 5). The figure shows the field measure of area percent covered by particles, against field numbers.

Figure 7:
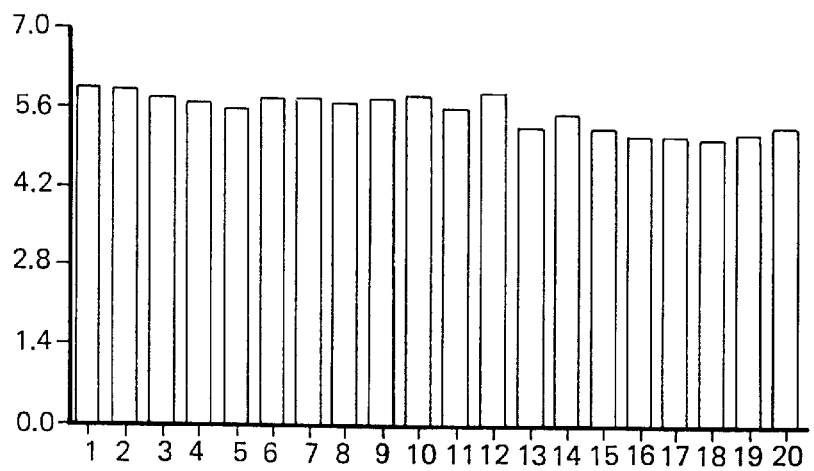

FIG. 7 is a corresponding image analysis of the film of FIG. 6 for the field measure of density of the particles in $1/mm^2(\times 1,000)$, against field numbers.

Figure 8:
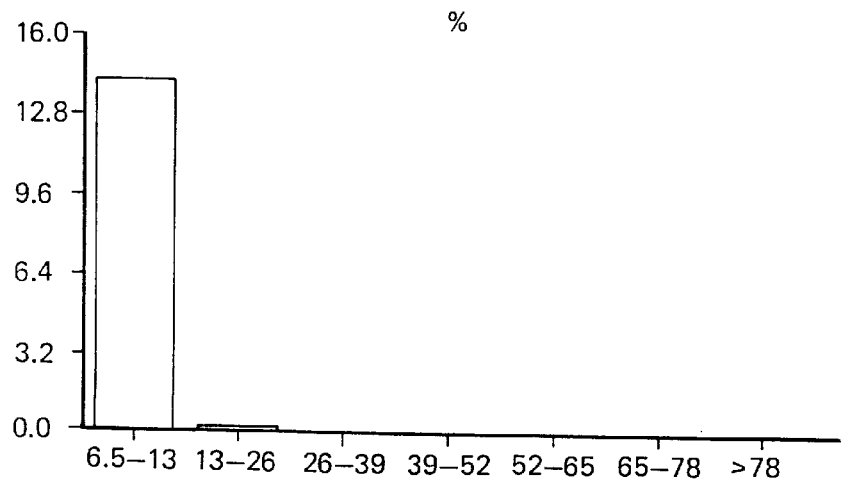

FIG. 8 is a corresponding image analysis of the film of FIG. 6 for characterization of aggregation of the particles by area measure of sample area (%) against size in micrometers.

Figure 9A:
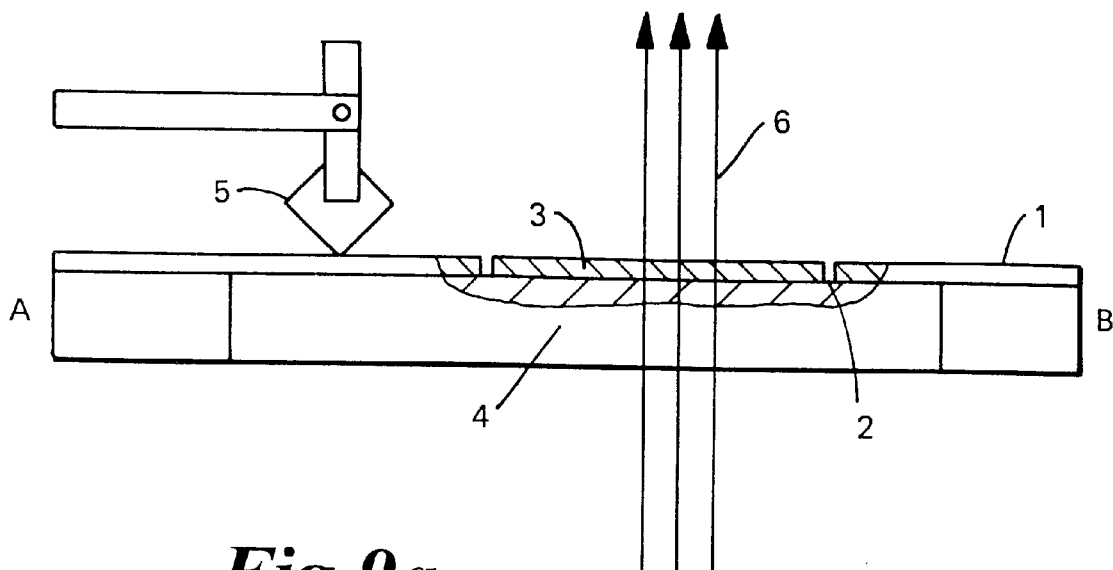
Figure 9B:
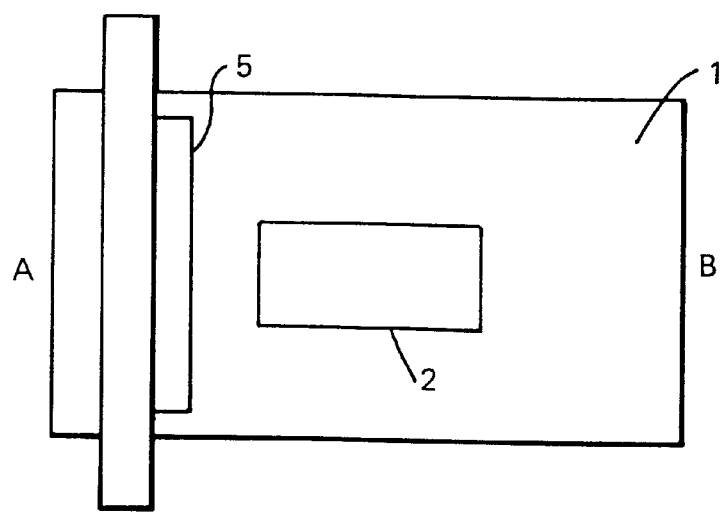

FIG. 9($a$) is a diagram (side view) of apparatus for carrying out the coating method of Example 6.

FIG. 9($b$) is a top view diagram of the apparatus of FIG. 9($a$).

Figure 10:
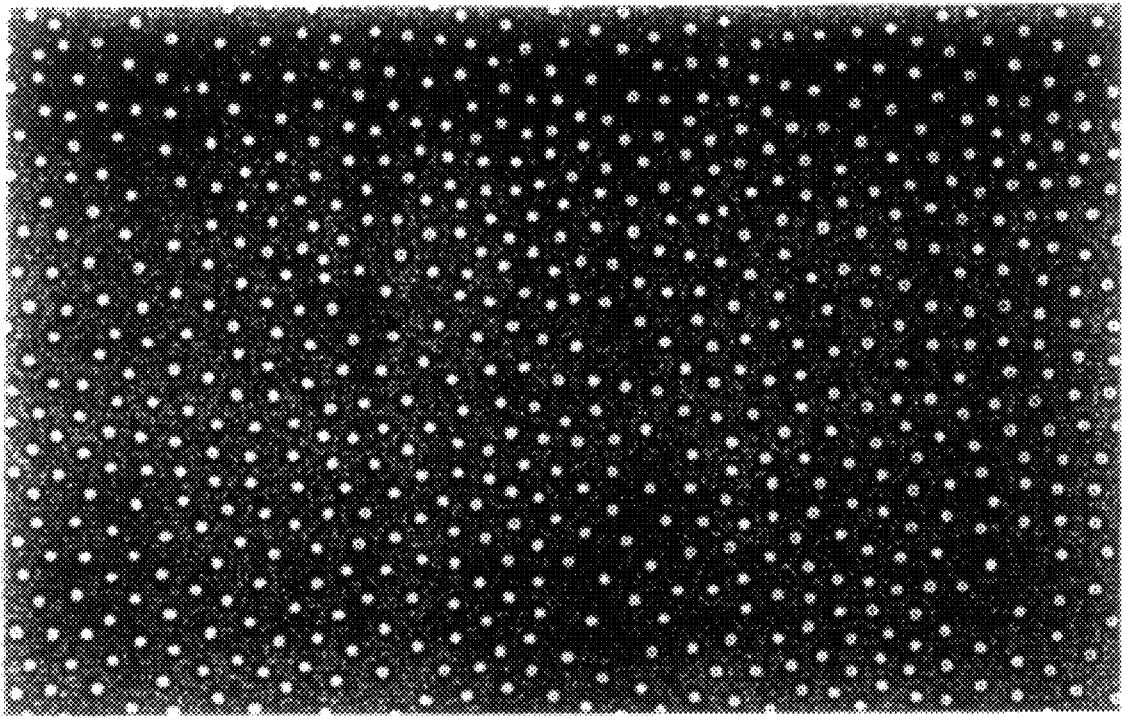

FIG. 10 is an optical photomicrograph of the coating of Example 6 at ×100 magnification. Transmission Field: approx. 730×490 micrometers. Particles approximately 10 micrometers in diameter.

Figure 11:
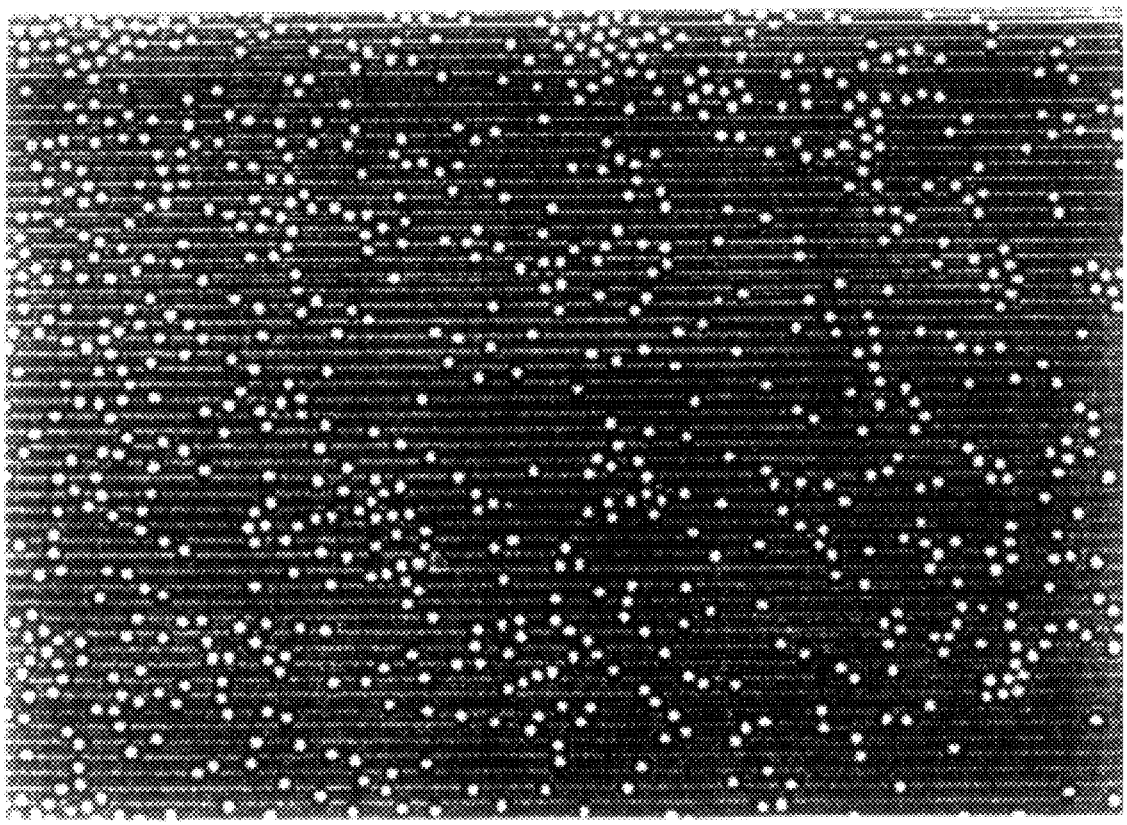

FIG. 11 is an optical photomicrograph similar to FIG. 10 of a coating prepared without the exposure to a magnetic field (comparative).

Figure 12:
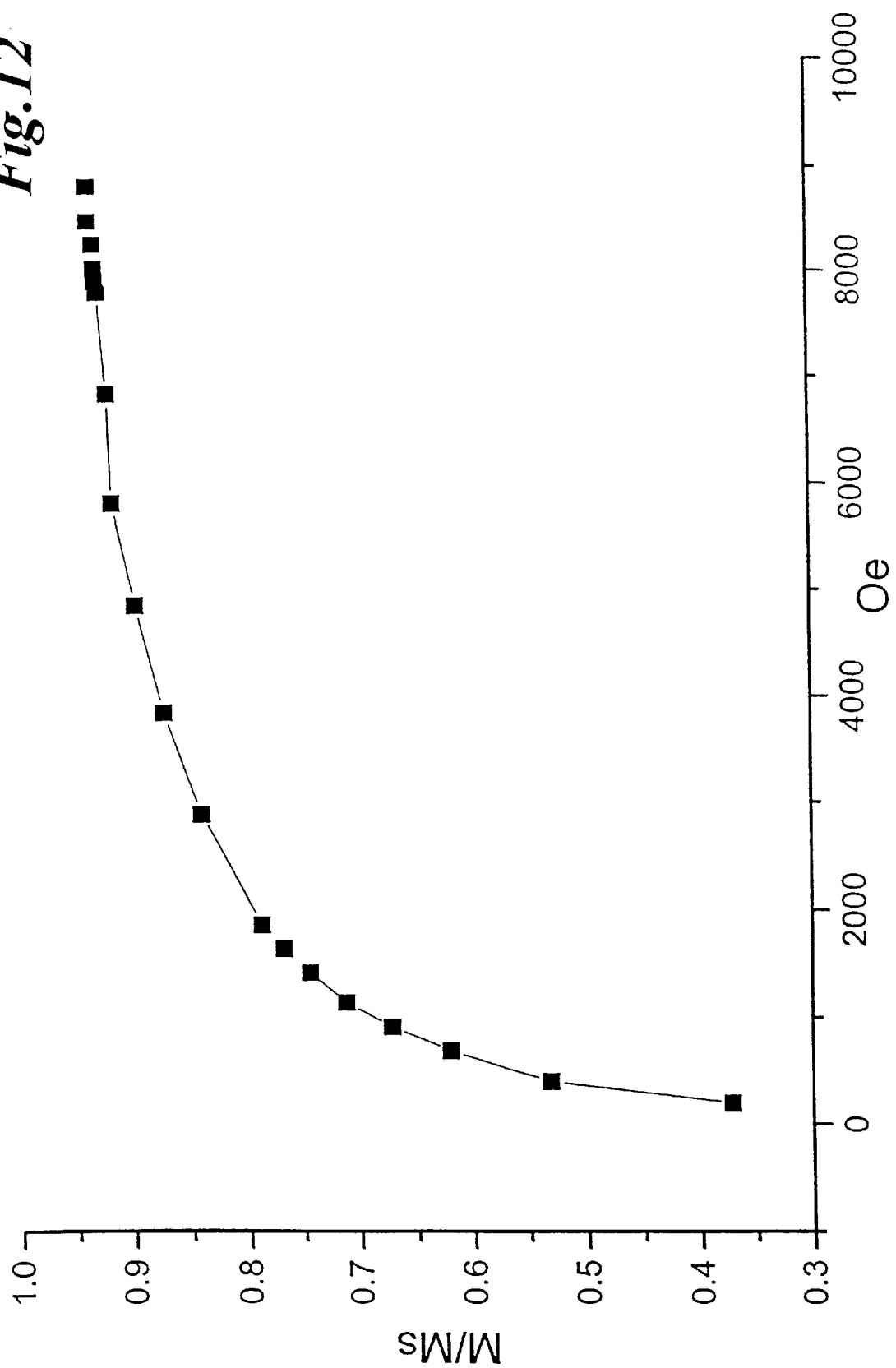

FIG. 12 is a magnetization curve as described in Example 7.

Figure 13:
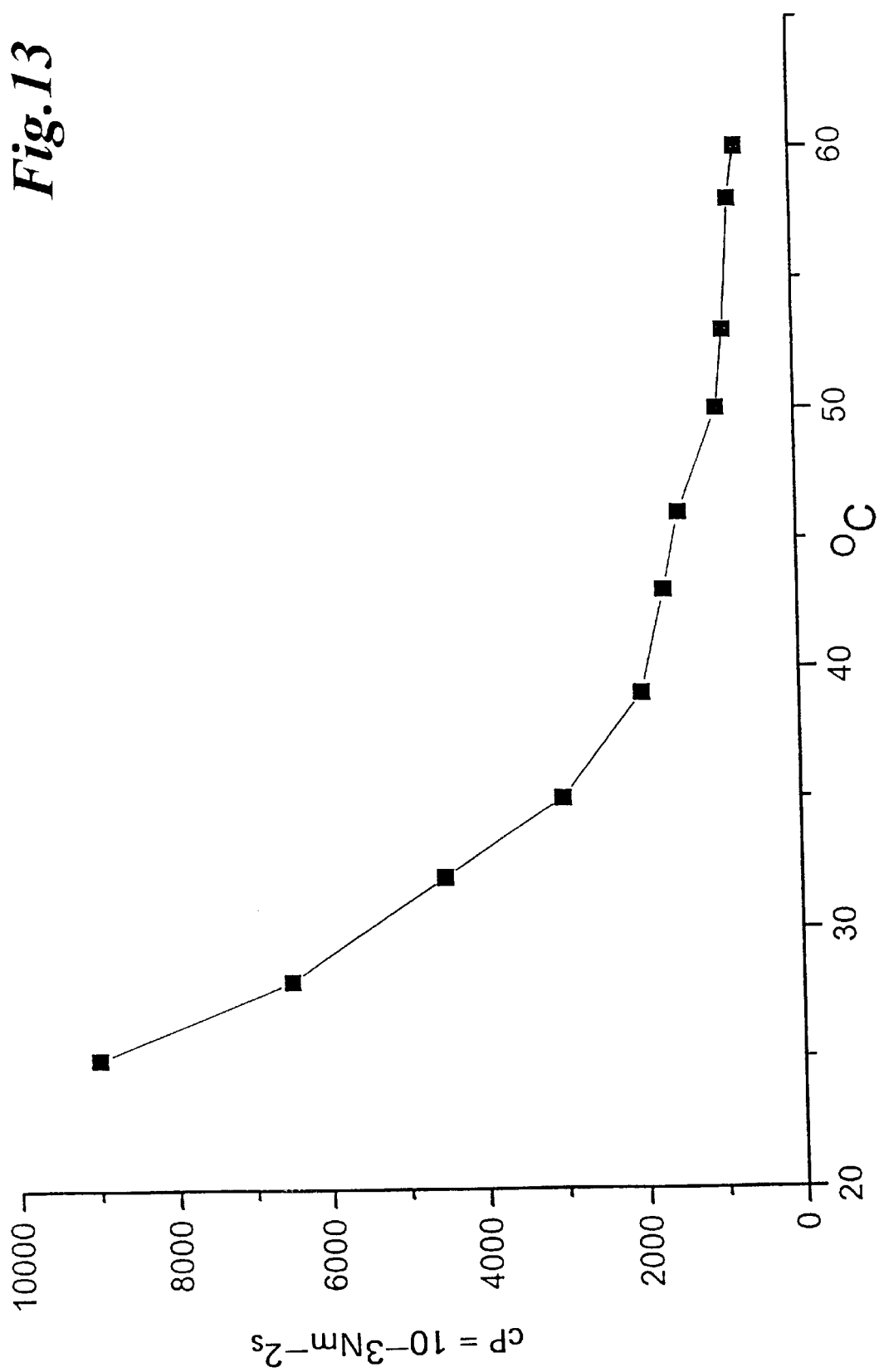

FIG. 13 is a viscosity-temperature profile as described in Example 7, viscosity being measured in centipoise ($Nm^{-2}s\times10^3$).

Figure 14A:
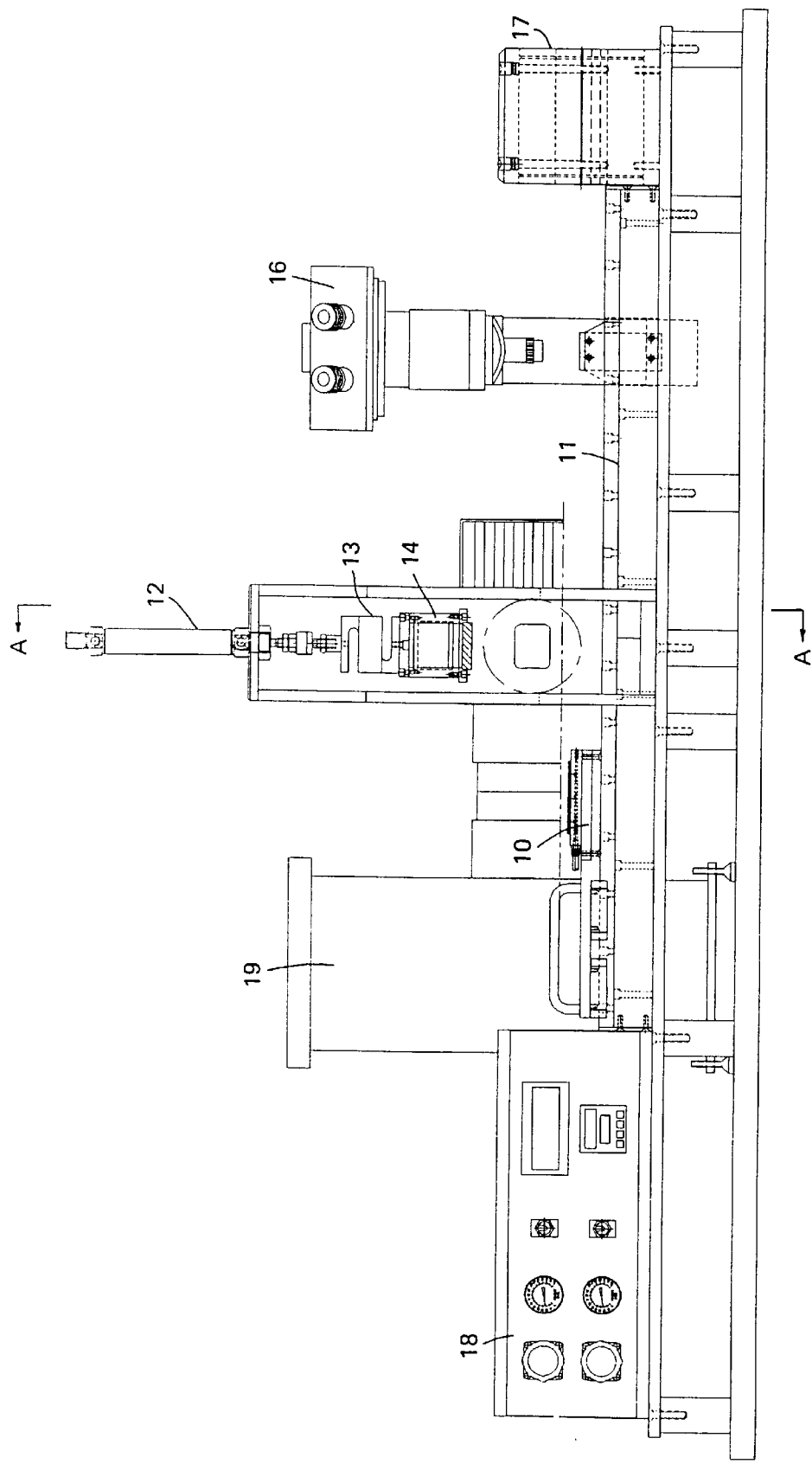
Figure 14B:
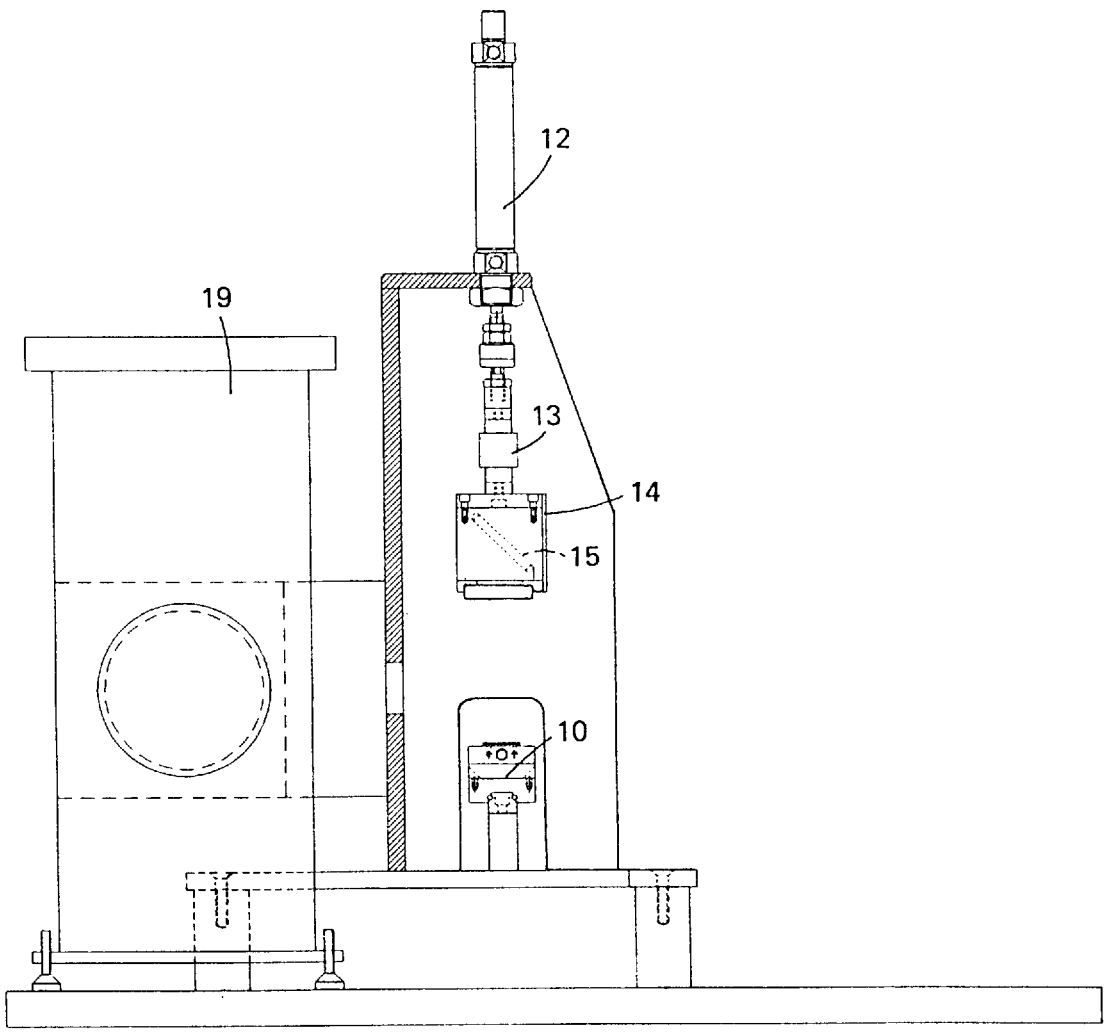

FIG. 14($a$) is a diagram in side elevation of an apparatus designed and built to produce films having anisotropic conductive pathways.

FIG. 14($b$) is a diagram in elevation of the apparatus of FIG. 14($a$), taken on the line A—A in FIG. 14($a$).

Figure 15:
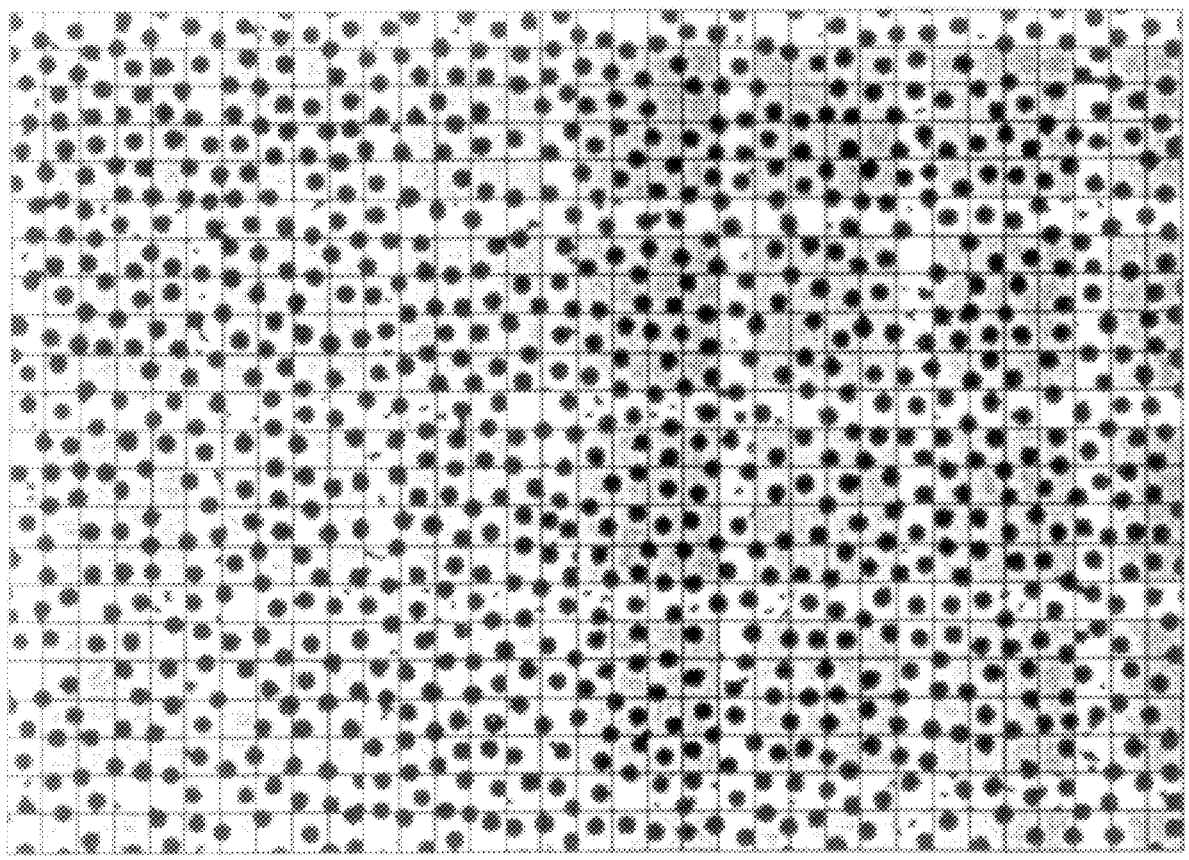

FIG. 15 shows an array of squares with 100 micrometer sides and separated by 25 micrometers superimposed on an optical photomicrograph of an A-staged free standing film containing 11.5 micrometer gold-coated polystyrene spheres (film prepared according to the method described in Example 10 using the formulation described in Example 11). The particles were ordered with a magnetic field prior to the photocuring step. In this Figure grey tones in the background have been reduced for clarity. The array of squares is computer-generated and is superimposed on the micrograph in the computer.

Figure 16:
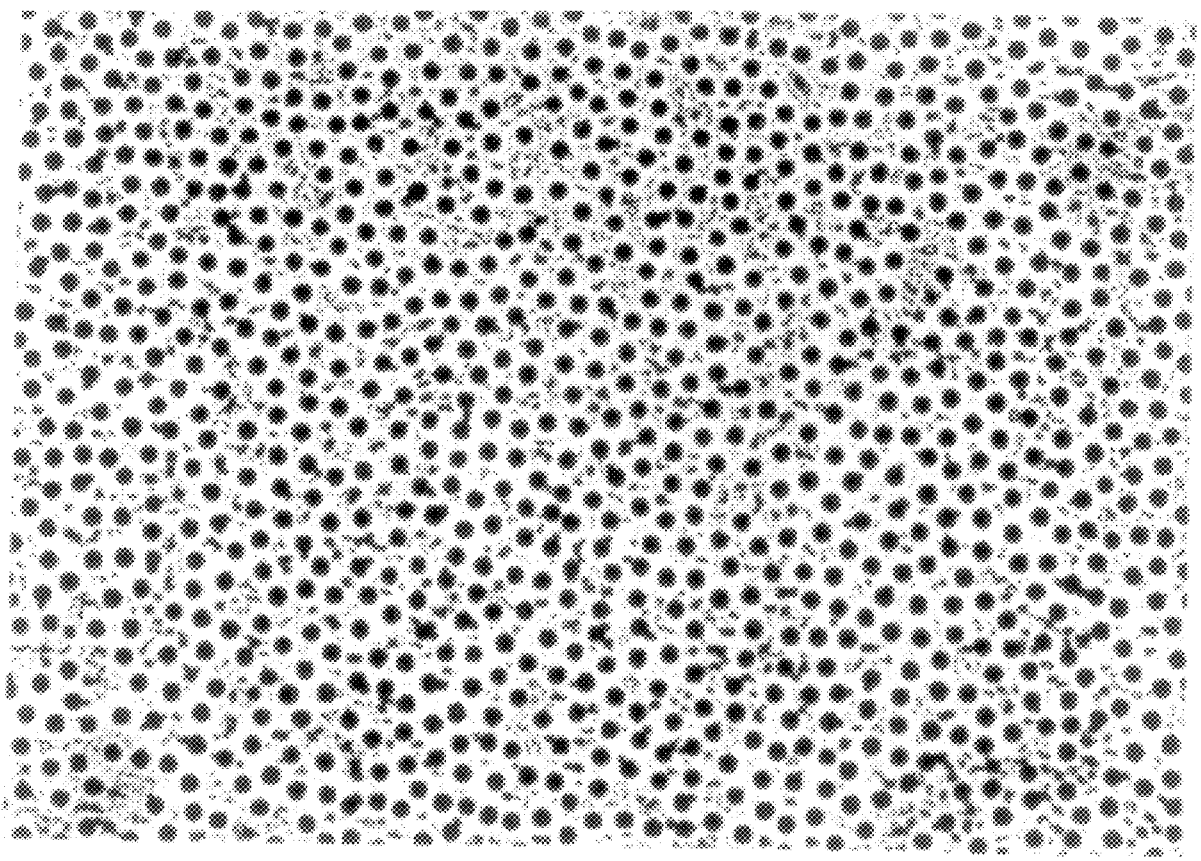

FIG. 16 is an optical photomicrograph depicting the same sample as described in FIG. 15 without the square array superimposed in the image. Grey tones have not been altered (cf FIG. 15).

EXAMPLE 5

Magnetite particles of average particle diameter 9.7 nanometers, (Liquids Research Limited, Unit 3, Mentech, Deiniol Road, Bangor, Gwynedd, U.K.) were coated with oleic acid and dispersed in heptane at an appropriate content (3.5% and 8.4%) by volume magnetite to produce fluids with magnetizable saturation of 100 G and 250 G as described below. Five milliliters of the above mentioned heptane-based material was added to 5 ml of butane diol dimethacrylate and a further 2 ml of a secondary surfactant was added which was an acid form of an aromatic phosphate ester sold under the Trade Mark GAFAC RE610 by GAF (Great Britain) Limited and now available as RHODAFAC RE610=GAFAC RE610 from Rhone Poulenc Chimie, France. This is described as nonoxynol-9-phosphate.

A good quality ferrofluid resulted with good stability. Fluids with magnetizable saturation of 100 G and 250 G were thus prepared. The saturation magnetization curve was steep and typical of superparamagnetic systems in that it exhibited no hysteresis. These fluids, even when formulated with radical initiators, were stable for periods of one year at room temperature when stored in air permeable polyethylene bottles such as those used for the storage of traditional anaerobic adhesives by those skilled in the art.

The butane diol dimethacrylate ferrofluids could be polymerized in the bulk with standard radical photo and/or thermal initiator systems.

To the butane diol dimethacrylate based ferrofluid of 100 G was added 10% weight/weight spherical gold-plated cross-linked polystyrene microparticles of 11 micrometer diameter and 6% w/w of photoinitiator 2,2-dimethoxy-2-phenyl acetophenone.

The said particles are essentially monodisperse (i.e. of substantially uniform shape and diameter) and are an article of commerce from Sekisui Fine Chemical Co Ltd, Osaka, Japan.

The particle loaded, photocurable ferrofluid adhesive composition was applied to a rigid, elongated substrate and a flexible or rigid release layer was placed on top to form a trilayer structure. When the upper layer was flexible, a further rigid substrate was placed on top to ensure flatness and that a uniform pressure was applied across the multilayer structure.

The multilayer structure was placed in the centre of a Halbach magnetic cylinder (Magnetic Solutions Ltd, Dublin, Ireland). The cylinder had a central bore of 28 mm and was 63 mm in length and delivered a uniform magnetic field of 0.26 T which was applied normally to the substrate (multilayer). After approximately one minute the multilayer was withdrawn and photocured for approximately 90 seconds with an EFOS Ultracure 100 SS UV lamp. The release layer was cleanly separated to leave a supported, cured coating with uniformly aligned conductive particles locked in place. In this way film section with high quality particle ordering could easily be achieved over areas greater than square centimeters. The quality of the ordering was assessed with an Optical Image Analyzer (Buehler Omnimet 3 Image Analyzer, Ill., U.S.A.). FIG. 6 illustrates the area percent coverage over 20 optical fields, the standard deviation over 20 fields was 0.806%.

The results in FIG. 6 are summarized as follows:

| | |
|---|---|
| Minimum | 14.993% |
| Maximum | 18.038% |
| Mean | 16.354% |
| Standard Deviation | 0.806% |
| Field Area | 100728.594 micrometers$^2$ |
| Total Area | 2.015 e + 06 micrometers$^2$ |
| Field Count | 20 |

FIG. 7 illustrates the density of particles distributed in the cured field over twenty randomly selected fields—the data indicate a mean of approximately 5668 particles per square millimeter.

The results in FIG. 7 are summarized as follows:

| | | |
|---|---|---|
| Minimum | 5291.447 | 1/mm$^2$ |
| Maximum | 6006.239 | 1/mm$^2$ |
| Mean | 5667.706 | 1/mm$^2$ |
| Standard Deviation | 240.559 | 1/mm$^2$ |
| Field Area | 0.101 | 1/mm$^2$ |
| Total Area | 2.015 | mm$^2$ |
| Field Count | 20 | |

A computer routine was written to identify the incidence of particle/particle interaction in the optical image so that any visual 'objects' of size substantially greater than the 11 micrometer diameter would be recorded and characterized as aggregates—the size of an aggregate being a multiple of this 11 micrometer diameter plus a small margin for geometric error. Thus the less than 13 micrometer size category can only capture single particle objects (nominally 11 micrometers), the 13–26 micrometer category can only capture dimers, or two particle aggregates (theoretically 22 micrometer maximum end to end length), and so forth for an optical field comprising a particle filled layer of monolayer thickness with respect to sphere diameter. FIG. 8 illustrates the data generated after examination of twenty randomly selected optical fields for the ordered, cured film.

The results in FIG. 8 are summarized as follows:

| | |
|---|---|
| 6.5–13 micrometers | 14.281% |
| 13–26 micrometers | 0.067% |
| 26–39 micrometers | 0.015% |
| 39–52 micrometers | 0% |
| 52–65 micrometers | 0% |
| 65–78 micrometers | 0% |
| 778 micrometers | 0% |
| Total Area | 2.015 e + 06 micrometers$^2$ |
| Field Count | 20 |

It can be seen that 99.5% of the area analyzed was in the form of discrete single particles and the remaining 0.5% occurred in dimeric form only. The twenty optical fields analyzed were typical of the larger ordered regions of the macroscopic sample. Twenty fields at 100× magnification corresponded to a total area of approximately 2 square millimeters and hence an average of 11336 particles from FIG. 7. Thus approximately 56 particles (0.5%) were not discrete or single particles in this experiment but were actually in dimeric form, that is, only 28 particles were paired in the entire area. Pairing of particles to this extent was probably due to inadequate wetting of these specific particles.

EXAMPLE 6

(a) In order to demonstrate the in situ ordering of magnetic holes in a ferrofluid coating, the following experiment was conducted. A DEK 245 high performance multipurpose screen printer was modified in such a way that a substantially uniform magnetic field could be applied to a specific area of an overlying substrate, such that the direction of the magnetic field was orthogonal to the substrate and the so-called 'worktable' of the printer (DEK Printing Machines LTD, Dorset, England). As shown in FIG. 9 the conventional worktable of the DEK 245 was replaced with a custom-built worktable which comprised a polished aluminum surface plate (320 mm×240 mm) (1) with a central milled depression (2) sufficient to accommodate a standard glass microscope slide (approximately 76 mm×25 mm) (3).

The polished plate was mounted over an array of flat permanent magnets arranged so that a stripe of magnetic material (4) some 170 mm long by 50 mm wide lay directly beneath the milled depression in the plate, the said depression being located approximately 70 mm from the squeegee (5) end of the stripe so that a magnetic field was developed in advance of the substrate (slide 3) with respect to the direction of print, the direction of print being that which moves squeegee blade (5) from left of FIG. 9(a) (A end) to the right of the FIG. 9(a)(B end). The magnetic stripe was constructed from a series of flat ferrite magnets each 40 mm×25 mm×8 mm (length×width×depth). These were poled across their thickness and collectively delivered approximately 400 Oe field strength, measured directly on the surface of the overlying polished plate. Each magnet had its flat face parallel to the face of polished worktable top plate (1) and was arranged so that the long dimension of each magnet was parallel to the long axis of the top plate. Flanking the central magnetic stripe on either side, were two similar stripes poled in the opposite direction to the central stripe. All three stripes were bonded together to complete a magnetic circuit with vertical flux lines rising up through the substrate coincident with the milled depression (2) in the top plate (1).

In comparative experiments where no magnetic field was required, the same polished top plate was used, but the array of underlying magnets was temporarily removed.

A particle-filled ferrofluid formulation was prepared based on a commercially available ferrofluid having a 1500 cps (1.5 Nm$^{-2}$s) viscosity (APG 057 available from Ferrofluids, Inc, N.H., U.S.A.) and 10 weight percent of transparent 11 micrometer cross-linked polystyrene spheres (Sekisui Fine Chemical Co., Osaka, Japan). The spheres were thoroughly dispersed in the formulation by vigorous mixing. The formulation was applied to the magnetic worktable (1) in a 20 mm stripe positioned about 20 mm in advance of the milled depression (2) which now contained a standard laboratory microscope slide (3). The worktable was raised to a position that would enable the printing of a thin coating of ferrofluid. The worktable position, printing speed, printing pressure, and squeegee type were adjusted in independent experiments to optimize coating for the particular formulation under consideration. The motorized squeegee blade pulled the formulation across the length of the microscope slide. During this coating action the filled fluid experienced a magnetic field. After the printing cycle the squeegee blade lifted free from the worktable surface and reverted to its original position in readiness for another operation.

The coated substrate (3) was examined optically using a microscope connected to an optical image analyzer. The latter equipment is capable of processing the image and assessing the quality of the field-induced ordering of particles in the ferrofluid. The particles order in the ferrofluid coating because they act as magnetic holes in the fluid matrix. The phenomenon of magnetic holes has been described by Skjeltorp (see for example "One and Two Dimensional Crystallization of Magnetic Holes" in Physical Review Letter, 51(25), 2306, 1983) in fluid films which are confined in a cavity formed by two rigid substrates. In this case, the coating was unconfined.

Image analysis of the coated substrate indicated that a substantially uniform film with discrete particles dispersed therein resulted as illustrated in FIG. 10.

A comparative experiment was conducted using the above mentioned formulation and methodology except that the array of magnets was removed from the underside of the worktable. The results of this experiment are indicated in FIG. 11 and clearly show that the particles are not uniformly dispersed nor isolated as discrete particle entities.

Although this Example was carried out using a non-curable ferrofluid composition and non-conductive particles, the Example illustrates the method which can be used in drawing down a coating in accordance with the invention, as described elsewhere herein.

(b) In order to demonstrate the effect with polymer-based systems, epoxy-novolac ferrofluid solutions were developed. These essentially comprised resinous materials dissolved in volatile ferrofluids derived from methyl ethyl ketone (MEK) and toluene.

Ferrofluid solvents having saturation magnetization ($M_s$) values of 112 and 166 G in MEK and toluene respectively were prepared. These were used to dissolve epoxy-novolac DEN 438 EK85 (Dow Deutschland, Werk Rheinmuenster) and bisphenol F epoxy monomers at an overall concentration of 20 w/w. The relative percentage weight of each constituent and curatives are listed below. The concentration, $M_s$, and viscosity of these solutions could be adjusted by solvent evaporation.

| | |
|---|---|
| Epoxy Bisphenol F Dow, US | 78% |
| DEN 438 EK85 (in ferrofluid solvent) | 13.9% |
| DICY (Dicyandiamide) | 7.0% |
| BDMA (benzyl dimethylamine) | 1.0% |

Conductive particles of 25 micrometer diameter were loaded at 10% w/w into the above-mentioned casting solutions and drawn down onto conductive substrates such as copper or gold clad FR4 boards. The boards were taped in place on an ACCU-LAB™ draw down coater (Industry-Tech., Oldsmar, Fla.) and the formulation was drawn down with Meyer rod to give a wet thickness of approximately 40 micrometers. The coated substrate was placed into a Halbach magnetic cylinder with the uniform field of 0.6 Tesla disposed normally to the sample plane. Poling was conducted when the film was still wet and solvent evaporation proceeded while the sample remained in the magnetic field until a tacky film was obtained. This was examined under the optical microscope and particle ordering was confirmed. The film was subsequently dried by warming at 80° C. for several hours (A-stage drying). Copper substrates were placed onto the dry films and were bonded by heating under pressure at 180° C. for approximately 30 minutes (B-stage). Whereas the above-mentioned formulations form a film that was too brittle to remove from the substrate even when release-coated, the Example nonetheless illustrates the method of locking particles in a polymeric matrix which is solidifiable by solvent evaporation (A-stage) and cross-linkable subsequently (B-stage).

EXAMPLE 7

An epoxy based formulation was prepared based on the following composition:

| COMPONENT | COMMERCIAL NAME/ SUPPLIER | WEIGHT % |
|---|---|---|
| Triglycidyl Aliphatic Ether Resin | HELOXY 5048 (Shell Chemicals) | 38% |
| Cycloaliphatic Epoxy Resin | CYRACURE UVR6351 (Union Carbide) | 10% |
| Bisphenol A Diglycidyl Ether Polymer | ARALDITE 6010 (Ciba) | 50% |
| Thermal and/or Photoinitiator 1 | IRGACURE 261 (Ciba) | 2%* |
| Photoinitiator 2 | GE1014 (General Electric) | 2%* |

*In both cases the initiators were as 50% solutions in propylene carbonate.

Therefore 2% above refers to 1% actual initiator (i.e. a 50% solution).

A liquid film of said composition photocured in an 'A' stage (primary cure) after 2×60 second exposures (one per side), yielded a supple solid film. This film could be transferred to a metal lapshear and an adhesive bond formed by overlapping with a further metal lapshear. When this 'sandwich' structure was clamped and heated to approximately 115° C. for 30 minutes, the metal lapshear specimens were strongly bonded (secondary cure).

The composition described above was rendered into a ferrofluid by the addition of precoated magnetite using techniques known to those skilled in the ferrofluid art and alluded to in Example 5 of the application and also in the parent application. The magnetization curve for the epoxy ferrofluid is shown in FIG. 12. The magnetization saturation for this fluid was 97 gauss. The viscosity-temperature profile for this fluid (designated) LOC 22 is illustrated in FIG.13.

The viscosity of the Ferrofluid was further modified by dilution with 10% of the CYRACURE UVR6351 cycloaliphatic epoxy resin. A thin liquid film of this composition could be photocured to form a supple film as noted previously. However the ferrofluidized version had increased exposure times (2.5 minutes per side), even with increased levels of the photoinitiators.

To the liquid epoxy ferrofluid composition was added 15% (w/w) 11.5 micrometer gold-coated polymer monospheres available from SEKISUI KK, Osaka, Japan.

Using this conductive particle loaded composition, a thin liquid film was prepared on two conductive substrates i.e. ITO coated glass and copper foil. In both cases, a transparent polyester film was placed on top of the liquid film. A further rigid substrate was placed on top of the polyester and pressure was applied by hand to squeeze the liquid film into position prior to poling in a uniform magnetic field of 0.6 Tesla in strength (applied normally to the substrate plane). Poling was conducted for a period of 1 to 5 minutes. Magnetic aligning times could be reduced by gently heating the sample prior to ordering. There is a pronounced drop in viscosity in the ferrofluid composition as a function of temperature. (FIG. 13).

Following magnetic ordering (poling), films were subsequently UV irradiated to induce an A-stage (primary) cure. After photocure the backing polyester film was removed to expose the conductive particle-loaded primary-cured epoxy solid coating on a conductive substrate. A further conductive substrate was then clamped onto the aligned conductive coating and measurements of contact resistance were recorded in the Z axis using the four point probe method and a GEN-RAD 1689 PRECISION DIGIBRIDGE. Contact resistance ranging from 40 to 100 milliohms were recorded for copper bonded to ITO (indium tin oxide). The primary cured film, sandwiched between conductive substrates was subsequently subjected to a B-stage (secondary) heat cure (110° C. for 30 minutes). The substrates were strongly bonded and Z axis contact resistance data was typically 50 milliohms for copper bonded to ITO (indium tin oxide).

EXAMPLE 8

As already described, adhesives derived from coatings or films can be made by B-staging a pre-cast material. In such cases, the primary solidification, or A-stage, may result from solvent evaporation and/or partially induced thermal cure. The A-stage, which has the function of locking conductor particle arrays in place, may equally be performed by chemical reactions which cause partial gelling at temperatures which are nevertheless well below the thermal threshold temperature required to trigger latent polymerization catalysts used to activate subsequent B-stages, e.g. <120° C. in the case of dicyandiamide (DICY). An example of a system that operates at room temperature involves reaction between multi-functional isocyanates and polyols to yield a polyurethane. The ferrofluid content of such a formulation may be derived from a ferrofluid polyol, a ferrofluid isocyanate or from some other monomeric system which does not enter into polyurethane formation but is present to provide subsequent heat cure, eg, ferrofluid epoxy or acrylic monomers. The formulation below has been used to order conductive particles and lock them in place by chemical reactions (polyurethane formation) at room temperature which were unassisted by light:

| | | |
|---|---|---|
| Hexamethylene Disocyanate | 1.1 | g |
| Hydroxy Ethyl Methacrylate (HEMA) | 0.7 | g |
| Ferrofluid-Butane Diol Diglycidyl Ether ($M_s$ = 343 G) | 1.47 | g |
| DICY | 0.07 | g |
| Benzyl Dimethylamine | 0.015 | g25 |
| micrometer Au coated polystyrene spheres | 0.1 | g |

Systems derived from ferrofluid versions of HEMA ($M_S$= 115 G; viscosity at 27° C.=5.5 cPs—0.0055 $Nm^{-2}s$) were also prepared. The HEMA based ferrofluid is however unstable.

An alternative approach to locking particles in ordered arrays in ferrofluid adhesives involves photochemistry. Thus the A-stage can be a photoinduced cationic or radical cure. Formulations which respond in this way may only partially cure with light, or may comprise two different types of reacting system which act independently (in the same or in different monomers). In the former cases a mixed cycloaliphatic and non-cycloaliphatic system may be partially cured with photocationic initiators and subsequently thermally cured in a B-stage process. In the latter case, a mixed acrylic-epoxy system may be designed and a photo-induced radical cure used to act on the acrylic functionalities to lock ordered conductor arrays in place. Examples which follow describe these approaches in detail.

EXAMPLE 9

In order to produce high quality anisotropically conductive adhesives or films (ACAs or ACFs respectively) it was necessary to design specialized formulations and specialized equipment. The film making equipment is illustrated in FIG. 14 and provides films up to approximately 20 square centimeters in area, although the test pieces routinely used were approximately 7.5 square centimeters in area. This example describes in detail the apparatus used to produce films and the processing steps involved.

As shown in FIG. 14, carriage 10 which is a flat platform constructed from polished non magnetic steel is used to hold the sample. The carriage comprises a vacuum chuck to hold a substrate in place as well as a cartridge heater capable of raising the platform temperature to approximately 100° C., and a thermocouple for temperature sensing. The carriage is mounted on a Tufnal base to prevent any thermal transfer to the substructure on which it rests. The carriage rides on single track 11, again constructed from non magnetic material. The arrangement is such that the mounted carriage assembly can be moved to specific positions from the leftmost side of the apparatus to the right. On so doing it can be passed into the central plane of large magnetic (Halbach) cylinder 17. When processing is finished, the carriage can be retracted and moved from the right of the apparatus to the left.

The ferrofluid adhesive formulation containing a plurality of conductors is applied to a release coated substrate mounted on top of carriage 10. The said substrate is flat and may be reflective. A similarly treated substrate is placed over the top of the ferrofluid adhesive film. This substrate is UV transmissive When the ferrofluid adhesive composition comprising a plurality of conductors is confined by the two substrates the disposition of the conductive particles is initially random in three dimensions. The confined fluid is brought and locked into position in the next step of the film making process. If initial film assembly is considered step 1 of the process, the second step may be described as 'wet film thickness determination'. In this second step, the assembled film is compressed by apparatus identified by numerals 12–14 in FIG. 14. The object of this compression stage is to produce a homogeneous fluid film occupying the entire area of the confining top substrate with excessive liquid being squeezed out around the entire periphery of the top substrate. Not only does the compression achieve a substantially uniform fluid film, but pressure is applied which produces a fluid layer between the substrates such that the liquid layer is less than two conductive particle diameters in thickness. This situation is referred to as a monolayer of conductive particles. The fluid film is however thicker than a particle diameter so that the individual particles are free to move in the XY plane of the sample.

The hardware used in this second stage comprises an air driven cylinder 12 capable of delivering a continuously variable pressure up to 20 Kgs per square centimeter, a pressure measuring device 13 and a specially designed cube 14 which eventually applies pressure to the film assembly. Cube 14 is open on one of its vertical faces to allow optical access for a UV beam. At a position corresponding approximately to the cube diagonal a high quality mirror 15, tuned to optimize UV reflection, is mounted at an angle of 45 degrees or less to deflect light downwards towards the underlying sample. The bottom face of the cube, i.e., that which is parallel to the sample plane, is a high quality fused silica optical flat 1 centimeter in thickness and approximately 5 centimeters on each side. This component is flat to $\lambda/4$ or better over 25 square millimeters measured at the green Ar ion laser line. The optical window in the cube base created by this component after mounting onto the cube assembly is 3 centimeters×3 centimeters. The optical flat sits proud from the base of the cube framework and hence applies pressure across an area up to 5 centimeters×5 centimeters. The entire assembly attached to the cylinder 12 can be made to appear weightless by differential pressure control to the cylinder regulated through precision controls in box 18. These controls also enable extremely gentle touch down of the assembly onto the sample below. Control box 18 further comprises heater control and feedback for the carriage cartridge heater. The remaining sides of the cube framework are polished metal optionally fitted with heat sinks on their outer surfaces. A heat sink may also be bonded to the rear side of the mirror within the cube to remove any heat generated by the lamp.

To generate a wet film having a thickness of approximately one conductive particle diameter, the pressure controls are regulated to compress the film assembly. This requires pressures typically in the order of a few Kgs per square centimeter. The pressure is then removed and the film remains essentially at the compressed thickness. The carriage 10 bearing the compressed film is then inspected in step 3. Inspection is conducted with reflective mode microscope 16 usually operating at 200× magnification. The length of the film can be scanned. The image is relayed to a monitor by a video camera attached to the trinocular head of the microscope. When the operator is satisfied that the film is a monolayer with respect to thickness, the assembly can be sent to the next process step. If the film is not a monolayer, it may be sent back a step and recompressed under different conditions until a satisfactory result is observed. Once in monolayer configuration, the film is advanced into the poling gate 17 which comprises a large Halbach magnetic cylinder with a circular aperture of approximately 55 millimeters and a length of approximately 140 millimeters. This permanent magnet has been designed and constructed to deliver a substantially uniform magnetic field over the vast majority of its length. The Halbach cylinder delivers a field of 0.6 T, the orientation of which may be controlled by rotating it in its cup shaped housing. The strength of the magnetic field was selected to substantially saturate the ferrofluid compositions employed. To achieve a uniform dispersion of conductive particles such as that depicted in FIG. 10, the field will be applied normal to the sample. It has however been found helpful to achieve very high degrees of order to first pole the sample with the field direction parallel to the sample then subsequently redirect the field to a position normal to the sample. The period required for poling depends on a number of parameters such as the composition of the fluid with regard to magnetizable material, magnetization saturation of the fluid at the specific field applied, the viscosity of the formulation, the temperature of the sample, etc.. The sample temperature can be regulated by heating the mounting platform 10.

After the fourth step of poling, the sample is retracted from the magnet and re-inspected to check for conductor particle ordering. If ordering is not satisfactory, the sample may be re-poled. At this fifth stage or at the third inspection stage, the video camera output may be connected to an optical image analyzer which provides quality control of the ordering process. The ordered fluid film is next retracted in step six back to the compression position. The ordered sample may be photocured at this point with or without pressure applied to the liquid film. In this process the sample is illuminated with UV light, item 19 in FIG. 14, to induce photocure and lock the arrayed conductors in place. An Oriel 1 kW XeHg arc lamp (LOT ORIEL, Leatherhead, Surrey, UK) with a 50 millimeter beam diameter and fitted with a dichroic mirror and electronic shutter was built into the film making fixture and used to partially cure, or A-stage, the ACFs. Following UV irradiation, the pressure, if applied, was released from the assembly and the cured film was carefully released from the substrates. The central section of the thus produced ACF, which was approximately 7.5 square centimeters in area, was used for physical testing.

Following cleaning or replacement of substrates, the operation could be repeated. The apparatus was designed to accommodate different types and sizes of conductor particles and different viscosity formulations. Process parameters could thus be obtained for continuous film making equipment.

EXAMPLE 10

A typical formulation designed for the above-mentioned processing equipment is described in the current example. Formulations must be designed, thus:

a) to produce an A-staged film, i.e., a solidifiable form which may be handled in a supported or unsupported form. The A-staged film may be used in a thermoplastic system.

b) to produce a further cure stage or B-stage, if a thermoset is required, which is activated by the end user to cause adhesion between substrates to be bonded together.

c) to be capable of ordering "magnetic holes" in its fluid state, for example through the use of magnetisable fluids; this requires careful consideration of fluid viscosity and/or its relationship with temperature or shear forces for example.

d) to comprise conductors of regular geometry which provide conductive pathways between the conductive pads on one substrate and the conductive tracks or pads on another.

For the purposes of this example and the apparatus detailed in Example 9, the A-stage is effected by photocure. However the use of heat, E-beam cure, solvent evaporation, cooling, in particular from a melt, chemical reaction, physical association phenomena, etc., are also valid means of effecting viscosity increases to an effectively solid A-staged condition which is used to lock arrays in place following ordering in an initial fluid state.

When photocure is used, it may be preferable to design a formulation such that the photocure mechanism is specific to certain formulation components and ineffective towards others. Thus, for example, an epoxy acrylate combination may be photocured by photolysis of a radical photoinitiator, such as benzophenone. In this case the acrylate functions are susceptible to cure whereas the epoxy functions are not. This scheme is preferable to a hybrid all epoxy formulation comprising a mixture of cycloaliphatic epoxies and bisphenol A type epoxies for example (cf. Example 7). In the latter case, cycloaliphatic epoxies are more susceptible to cationically induced photocure than the bisphenol A type epoxies, so that an A-stage can be effected. However, because the hybrid formulation comprises epoxies only, no clear distinction can be made and a proportion of bisphenol A epoxies, destined to subsequently cure in a B-stage, may undesirably cure during the A-stage. If this happens the ultimate strengths achievable after B-staging may be adversely affected.

In order to achieve extremely high degrees of ordering of conductors in the ferrofluid version of the adhesive formulations, it is preferable that the viscosity be less than 1500 cPs (1.5 $Nm^{-2}s$) and most preferably less than a few hundred cPs or less at the poling operation temperature. It may also be preferable to ensure that the initial formulation is all liquid in nature before addition of conductive particles. For example liquid anhydride hardeners may be used to effect epoxy cure in the B-stage as alternatives to DICY. The preference for all liquid systems relates to the fact that any included particle in a ferrofluid formulation behaves as a "magnetic hole" once stimulated by a magnetic field.

Thus conventional heterogeneous hardeners for epoxies such as dicyandiamide (DICY) if used would behave like "magnetic holes". While this is not a problem per se, and may even be thought of as advantageous with regard to the distribution of curatives throughout the adhesive, particles of this sort may interweave with the conductor array and hence produce less than a substantially highly-ordered array of conductive particles. This however becomes less of a problem if the DICY is of small particle size, particularly if it is smaller in size than the conductive particles. A disadvantage of anhydride cured epoxies is cure speed. However it is known to those skilled in the art, that catalysts accelerate anhydride cure substantially. Suitable catalysts may be liquids such as benzyl dimethylamine (BDMA) or semi solids such as the HX epoxy hardener pastes from Asahi Chemical Industry Co. Ltd. An example of a catalyzed formulation suitable for ACFs is described below:

| Component | Supplier | Description | Percentage w/w |
|---|---|---|---|
| Ebecryl Resin 604 | ucb Chemicals Drogenbos, Belgium | Acrylated epoxy | 16.8 |
| Dihydrodicyclo Pentadienyl Oxyethyl Methacrylate | Rohm & Haas, Germany | Acrylate | 23.6 |
| Butane diol diglycidyl ether (BDDGE) | Aldrich, US | Epoxy | 15.8 |
| Bisphenol F | Dow, US | Epoxy | 15.8 |
| Nadic Anhydride | Aldrich, US | Latent Hardener | 21.5 |
| Irgacure 1700 | Ciba-Geigy, UK | Photoinitiator | 3.0 |
| HX3722 | Ashai, Japan | Catalyst | 3.9 |

Such a formulation photocures after 20 seconds irradiation by a medium pressure UV arc lamp at a film thickness of approximately 25 micrometers. A Si die of 36 mm$^2$ was placed on top of the photocured (A-staged) film and bonded to a FR4 board with 100N force and 90 seconds heat treatment at approximately 180° C. Average die shear forces of around 450N were recorded for this size of die.

A version of the above formulation was built up by mixing ferrofluid adhesive monomers with standard monomers as outlined below:

| Reference Number | Component | Percent w/w |
|---|---|---|
| 1 | FF* - Ebecryl Resin 604 | 7.3 |
| 2 | FF - Dihydrodicyclo Pentadienyl Oxyethyl Methacrylate | 3.0 |
| 3 | FF - Bisphenol F | 14.8 |
| 4 | Butane diol diglycidyl ether (BDDGE) | 15.0 |
| 5 | Ebecryl Resin 604 | 9.5 |
| 6 | Dihydrodicyclo Pentadienyl Oxyethyl Methacrylate | 19.5 |
| 7 | Nadic Anhydride | 24.5 |
| 8 | Irgacure 1700 | 3.0 |
| 9 | HX3722 | 3.5 |

FF* refers to ferrofluid monomers prepared by Liquids Research Limited - see Example 5.

This can be performed either by adding two monomers to a third which has already been converted to a ferrofluid, or using a blend of monomers as a single polymerizable carrier. In the former case, the production of a typical ferrofluid based upon the low viscosity monomer Dihydrodicyclo Pentadienyl Oxyethyl Methacrylate (Ref 2 above) is detailed below:

Heptane intermediate:

Dissolve 404 g of Ferric Nitrate in pure water and make up to 500 mls. Dissolve 150 g of Ferrous Sulphate Heptahydrate in water and make up to 500 mls. Mix the above solutions together and add 450 mls of ammonia solution (specific gravity 0.88). Add 150 mls of oleic acid. Acidify the solution and separate the solid magnetite. Wash solids copiously with water and redisperse in heptane.

Production of Dihydrodicyclo Pentadienyl Oxyethyl Methacrylate ferrofluid using heptane stock:

Precipitate the required amount of heptane fluid and separate the solids. Add 0.3 ml/100 emu* of a phosphate ester surfactant such as GAFAC RE610 and 0.3 ml/100 emu of dispersant Bykanol-N from Byk—chemie GmbH, D-4230 Wesel, Germany. Add the required amount of monomer and heat to evaporate the residual solvent.

*emu is "electro magnetic unit" which is an alternative unit for the expression of magnetic saturation. 4xPix ferrofluid density converts emu/g to Gauss units.

The approximate component percentages resulting from the above procedure are:

Dihydrodicyclo Pentadienyl Oxyethyl Methacrylate=80%

Oleic acid=5%

Magnetite=5%

Bykanol-N=<5%

Phosphate ester=5%

The above composition produces a ferrofluid of Dihydrodicyclo Pentadienyl Oxyethyl Methacrylate with a magnetization saturation of approximately 100 Gauss. Stronger fluids require additional loading of magnetite. The ultimate strength of the fully formulated adhesive composition is determined by dilution of high strength monomeric ferrofluids which are relatively easy to prepare, with more viscous non-ferrofluid monomers. The three constituents of the above-mentioned formulation, reference numbers 1–3, were derived from a single ferrofluid made up from these components in the appropriate ratios. A stable colloidal blend resulted with a viscosity at 27° C. of 1800 cPs (1.8 Nm$^{-2}$s) and an M$_s$ of 135 Gauss.

The ferrofluid adhesive formulation set out in the above-mentioned table was cured and mechanically tested in the same way as the non-ferrofluid version of the formulation. Average die shear strengths of approximately 260N were recorded. Additionally when the formulation was loaded with 10% w/w 25 micrometer Au-coated polystyrene spheres and aligned in a magnetic field, then A and B-staged according to the invention, Z-axis contact resistance measurements using the four point probe method recorded 10 mOhms with an upper Cu substrate and a Au-coated FR4 lower substrate.

To minimize migration or exudation of a surfactant in the ferrofluid adhesive composition, it may be advantageous to utilize a reactive or polymeric surfactant such as available from Monomer-Polymer and Dajac Laboratories Inc. Trevose, Pa. 19047, U.S.A.. (see also Wu, H. F. et al., Polymer Composites, 12(4), 281, 199; Rao, A. V. et al., Paint and Ink International, 15,1995; Holmberg, K, Surface Coatings International, (12), 481, 1993).

EXAMPLE 11

In the present example, photochemistry is also used to invoke A-stage cure, however the constituents of the formulation which are responsive to photocure are derived from acrylic monomers rather than epoxies. The basic formulation is detailed below:

| Reference Number | Component | Percent w/w |
|---|---|---|
| 1 | Epoxy-Acrylate Resin IRR282, ucb Chemicals, Drogenbos, Belgium | 36.71 |
| 2 | Bisphenol F, Dow, US | 10.84 |
| 3 | Irgacure 1700, Ciba-Geigy, UK | 3.85 |
| 4 | Butane diol diacrylate | 26.92 |
| 5 | DICY | 5.24 |
| 6 | Benzyl dimethylamine | 0.35 |
| 7 | Au-coated spheres, Sekisui KK, Osaka, Japan | 16.08 |

In order to optimize viscosity and magnetic strength of the formulation, item 1 was derived from an IRR282 based ferrofluid ( $M_s$ 115 G; viscosity at 27° C. of 115 cPs=0.115 $Nm^{-2}s$) and 29.86% of item 4 was derived from a butane diol diacrylate based ferrofluid ($M_s$ 116 G; viscosity at 27° C. of 12 cPs=0.012 $Nm^{-2}s$). The ferrofluids were prepared by Liquids Research Limited—see Examples 5 and 10. The residual balance of item 4 was derived from pure butane diol diacrylate monomer. The formulation formed a stable colloid when all ingredients were admixed. The magnetic strength of the resulting low viscosity formulation was approximately 50 G. The gold-coated spheres were either exclusively 12, or exclusively 25 micrometers in diameter.

Formulations of this type have been designed to A-stage cure to a handleable solid form which may be either supported or unsupported. In this case the films were unsupported or free standing. The system responsive to photocure is acrylic and reacts independently of the epoxy system, thus forming a network of partially crosslinked polyacrylate surrounded by epoxy moieties which are subsequently reacted in the B-stage. The IRR282 resin, being a hybrid epoxy acrylate, serves to knit together the interpenetrating network of acrylic polymer and epoxy polymer after heat activation. Alternatively, the acrylic film forming resins may bear no hybrid epoxy function so that the two systems remain entirely independent after polymerization in the separate cure cycles. Formulations of the type described in this example, which form a soft film which has unreacted, meltable epoxy monomers interspersed throughout its structure may be used to form anisotropically conductive films with a A-stage cured film thickness greater than the diameter of one conductive filler particle but less than two particle diameters. Because of the softness of the A-staged film and the fact that the epoxy monomers may melt and are unreacted at this stage, conductor pads on substrates to be bonded penetrate through the film until they make contact with the conductive filler particle which lies slightly below the surface of the A-staged film. This process is encouraged by the B-stage cure conditions which require the application of pressure at elevated temperatures which are well in excess of the melting temperatures of the epoxy monomers.

This formulation was used in conjunction with the apparatus described in Example 9 to produce free standing films comprising ordered arrays of conducting particles, said films being capable of subsequent heat activation (B-staging) to produce an adhesive bond. When such films, comprising 25 micrometer gold-coated spheres, were used to bond copper studs to gold-coated FR4 boards, Z-axis contact resistance measurements performed using four point probe methodology indicated resistance in the range 16–22 mOhms. When the same formulation was prepared and films produced comprising particles of identical diameter and core material but with no conductive coating thereon, Z-axis contact resistance measurements indicated electrical open circuits with resistance estimated to be in the order of several hundred kOhms or MOhms.

Silicon die, 36 $mm^2$ in area, were bonded to bare FR4 boards, using said free standing films and 100N force applied for 90 seconds with a bondline temperature of approximately 180° C. The samples were let stand at room temperature before shear testing using an Instron tensile tester with a specially designed sample holder. Die push off strengths of 150N were typical for the above formulation and bonding conditions.

FIG. 15 illustrates an array of squares with 100 micrometer sides, separated by 25 micrometers in both X and Y directions, superimposed on top of an A-staged free standing film prepared from the formulation in the current example. The array of squares simulates an array of similarly sized and positioned electrode pads on a Silicon device, or so-called 'flip chip' device.

The magnetic hole nature of the particles gives rise to a repulsive force when the system is poled with a field oriented normally to the sample plane. This causes the non-magnetic particles to essentially repel one another and separate which minimizes the potential for cross connections between electrode pads superimposed or brought into contact with the film. The mottled grey texture in the figure is due to crystals of DICY (dicyandiamide) embedded in the A staged film. These can be more clearly discerned in FIG. 6. DICY acts as a latent hardener catalyst used to initiate the B-stage cure reactions of the epoxide components of the formulation. The DICY crystals themselves will behave as magnetic holes, albeit irregular ones, and their separation by mutual repulsion, in principle, serves to aid the uniformity of cure through a more uniform dispersion of the curative. The DICY crystals so dispersed do not interfere adversely with the distribution of the conductive magnetic hole spheres as can be seen from FIG. 15 in which the square simulated pads are separated by 25 micrometers in each of the X and Y directions (parallel to the edges of the Figure). DICY may be deployed in the formulation but be removed from the interstitial spaces between conductive magnetic hole spheres by first coating said spheres with DICY so that the latent hardener occupies the same position in the formed array as the conductive particle. Heating such a coating above the melting point will cause it to induce cure in the epoxide and flow from the conductive particle. Alternatively, liquid latent hardeners may be used to replace the heterogeneous solid hardeners such as DICY. An example of a latent liquid hardener which does not interfere with the distribution of conductive particles is nadic anhydride (Example 12).

FIG. 15 shows no incidence of cross connection between simulated pads arising from strings or aggregates of particles.

Whereas the acrylic functions in the formulation serve to generate free standing handleable films with latent adhesive properties, and the epoxy functions serve to polymerize during B-stage operations, the dual functional IRR282 material enters into both types of reaction and serves to tie the epoxy and acrylic systems together.

EXAMPLE 12

A formulation similar to that described in Example 11 was prepared according to the details set out below:

| Reference Number | Component | Percent w/w |
|---|---|---|
| 1 | FF* - Epoxy-Acrylate Resin IRR282, ucb Chemicals, Drogenbos, Belgium | 26.8 |
| 2 | Bisphenol F, Dow, US | 12.5 |
| 3 | Irgacure 1700, Ciba-Geigy, UK | 4.5 |
| 4 | Butane diol diacrylate | 20.4 |

-continued

| Reference Number | Component | Percent w/w |
|---|---|---|
| 5 | Nadic Anhydride, Aldrich, UK | 18.36 |
| 6 | HX3722 | 2.5 |
| 7 | Au-coated spheres, Sekisui KK, Osaka, Japan | 15.0 |

FF* refers to ferrofluid monomer prepared by Liquids Research Limited - see Examples 5 and 10.

This formulation relies on the liquid latent epoxy curative, Nadic Anhydride. The formulation had a magnetic strength of approximately 31 G. Alignment of conductor particles was facilitated by gentle heating before photocure. Free standing 25 micrometer films were produced after 20 seconds of UV irradiation. Si die 36 mm$^2$ in area were bonded in a B-stage operation on the photocured film which entailed 90 seconds of thermal treatment at 180° C. and 100N force applied to the die with flip-chip bonding equipment ('Fineplacer', FINETECH electronic, Berlin, Germany). Average die shear strengths of 140N were recorded. Electrical measurements in the Z-axis show the film to have 120 mOhm resistance after B-staging.

While the invention has been illustratively described herein with reference to various preferred features, aspects and embodiments, it will be appreciated that the invention is not thus limited, and may be widely varied in respect of alternative variations, modifications, and other embodiments, and therefore the invention is to be broadly construed as including such alternative variations, modifications, and other embodiments, within the spirit and scope of the invention as claimed.

What is claimed is:

1. A method of forming a monolayer non-random array of particles, said method comprising the steps of:
   (a) applying to a substrate a curable ferrofluid composition having particles contained therein, said particles having a particle size on at least one dimension of at least one micrometer;
   (b) exposing the particle-containing ferrofluid composition to a source of energy suitable for effecting polymerization of the curable ferrofluid composition for a sufficient time to effect polymerization of a layer of the curable ferrofluid composition having a thickness of no more than 50% of the height of the largest particles, while the particles are arrayed in a non-random pattern as a result of application of a magnetic field; and
   (c) optionally, removing the uncured curable ferrofluid composition.

2. A method of forming a monolayer non-random array of particles, said method comprising the steps of:
   (a) applying a composition comprising a ferrofluid composition and particles, said particles having a particle size on at least one dimension of at least one micrometer, to a substrate which has a surface of latent adhesive material;
   (b) subjecting the composition to a magnetic field for a sufficient time to array the particles in a non-random manner in the composition;
   (c) pressing the particles onto the adhesive surface of the substrate; and
   (d) removing the ferrofluid composition.

3. A method of forming a monolayer non-random array of particles, said method comprising the steps of:
   (a) applying a composition comprising a ferrofluid composition and particles, said particles having a particle size on at least one dimension of at least one micrometer, to a substrate which has a surface of latent adhesive material; and
   (b) subjecting the composition to a magnetic field for a sufficient time to order the particles in a non-random manner in the composition;
   (c) adhesively binding the particles arrayed in a non-random manner to the substrate by pressing said particles onto the adhesive surface of the substrate and activating the latent adhesive; and
   (d) removing the ferrofluid composition.

4. A method of forming a film having a monolayer non-random array of particles therein, said method comprising the steps of:
   (a) applying a composition comprising a ferrofluid composition and particles, said particles having a particle size on at least one dimension of at least one micrometer, to a substrate having a surface of adhesive material;
   (b) subjecting the composition to a magnetic field for a sufficient time to array the particles in a non-random manner;
   (c) pressing the particles onto the adhesive surface of the substrate;
   (d) removing the ferrofluid composition;
   (e) applying a film-forming material to fill the interstitial spaces between the particles and optionally to cover areas of the adhesive surface flanking the particles to a film-thickness similar to that of the particle-containing areas;
   (f) optionally, at least partially solidifying the film-forming material; and
   (g) optionally, removing the so-formed film from the adhesive surface.

5. A method of forming a film having a monolayer non-random array of particles therein, said method comprising the steps of:
   (a) applying a composition comprising a ferrofluid composition and particles, said particles having a particle size on at least one dimension of at least one micrometer, to a substrate which has a surface of latent adhesive material;
   (b) subjecting the composition to a magnetic field for a sufficient time to array the particles in a non-random manner in the composition;
   (c) adhesively binding the particles arrayed in a non-random manner to the substrate by pressing said particles onto the adhesive surface of the substrate and activating the latent adhesive;
   (d) applying the film-forming material to fill the interstitial spaces between the particles and optionally to cover areas of the adhesive surface flanking the particles to a film-thickness similar to that of the particle-containing areas;
   (e) optionally, at least partially solidifying the film-forming material; and
   (f) optionally, removing the so-formed film from the adhesive surface.

6. A method of forming a stock wax film containing a monolayer non-random array of particles, said method comprising the steps of:
   (a) applying a composition comprising a ferrofluid wax composition and particles, said particles having a particle size on at least one dimension of at least one micrometer, to a first substrate;

(b) providing the ferrofluid wax composition at a temperature above its melting point;

(c) subjecting the composition to a magnetic field for a sufficient time to array the particles in a non-random manner while maintaining the ferrofluid wax composition at a temperature above its melting point;

(d) cooling the ferrofluid wax composition to a temperature below its melting point while the particles are arrayed in said non-random pattern; and (e) optionally, removing the first substrate from the wax film.

7. A method of forming a monolayer non-random array of particles, said method comprising the steps of:

(a) applying the wax film prepared in accordance with claim 6 to a second substrate having a surface of, optionally latent, adhesive material;

(b) adhesively binding the particles to a second substrate by pressing said particles onto the adhesive surface of the second substrate, activating the latent adhesive, if present, and elevating the temperature of the wax film and/or the second substrate to a temperature above the softening point of the wax film;

(c) removing the ferrofluid wax composition; and (d) optionally, removing the first substrate if it has not already been removed.

8. A method of forming a monolayer non-random array of particles according to claim 7 wherein the adhesive or latent adhesive is a film-forming adhesive and the particles in step (b) are pressed into the adhesive to a depth of at least 50% of the height of the largest particles.

* * * * *